United States Patent [19]

Takasu

[11] Patent Number: 5,635,411
[45] Date of Patent: *Jun. 3, 1997

[54] METHOD OF MAKING SEMICONDUCTOR APPARATUS

[75] Inventor: Hidemi Takasu, Kyoto, Japan

[73] Assignee: Rohm Co., Ltd., Kyoto-fu, Japan

[ * ] Notice: The term of this patent shall not extend beyond the expiration date of Pat. No. 5,296,086.

[21] Appl. No.: 254,677

[22] Filed: Jun. 6, 1994

Related U.S. Application Data

[62] Division of Ser. No. 963,705, Oct. 20, 1992, abandoned.

[30] Foreign Application Priority Data

Nov. 12, 1991 [JP] Japan ................................. 3-295577
Nov. 12, 1991 [JP] Japan ................................. 3-295579
Nov. 12, 1991 [JP] Japan ................................. 3-295581

[51] Int. Cl.$^6$ ............................. H01L 21/76; H01L 21/20
[52] U.S. Cl. ........................... 438/311; 438/410; 438/481; 438/355
[58] Field of Search .................. 257/347, 512, 257/517, 506, 552, 555; 437/83, 89, 33, 31, 84, 239, 62, 21, 90, 985, 61; 117/73; 148/DIG. 87, DIG. 115

[56] References Cited

U.S. PATENT DOCUMENTS

| | | | |
|---|---|---|---|
| 4,433,471 | 2/1984 | Ko et al. | 257/512 |
| 4,512,075 | 4/1985 | Vora | 257/512 |
| 4,604,162 | 8/1986 | Sobczak | 437/62 |
| 4,637,127 | 1/1987 | Kurogi et al. | 437/89 |
| 4,749,441 | 6/1988 | Christianson et al. | 437/249 |
| 4,760,036 | 7/1988 | Schubert | 437/90 |
| 4,814,287 | 3/1989 | Takemoto et al. | 437/62 |
| 4,845,048 | 7/1989 | Tamaki et al. | 437/62 |
| 4,879,255 | 11/1989 | Deguchi et al. | 437/89 |
| 4,925,805 | 5/1990 | van Ommen | 257/347 |
| 5,106,775 | 4/1992 | Kaga et al. | 437/62 |
| 5,124,276 | 6/1992 | Samata et al. | 437/89 |
| 5,212,397 | 5/1993 | See et al. | 257/347 |
| 5,252,143 | 10/1993 | Chiang et al. | 437/89 |
| 5,266,517 | 11/1993 | Smayling et al. | 437/89 |
| 5,296,086 | 3/1994 | Takasu | 117/43 |
| 5,308,445 | 5/1994 | Takasu | 437/89 |
| 5,336,633 | 8/1994 | Tsuruta | 437/89 |
| 5,417,180 | 5/1995 | Nakamura | 117/43 |

FOREIGN PATENT DOCUMENTS

| | | | |
|---|---|---|---|
| 388733(A) | 3/1989 | European Pat. Off. | 437/89 |
| 58-175844 | 10/1983 | Japan | 437/89 |
| 63-233534(A) | 9/1988 | Japan | 437/89 |
| 4-364022(A) | 12/1992 | Japan | 117/43 |
| 5-326399 | 12/1993 | Japan | 437/84 |

*Primary Examiner*—John Niebling
*Assistant Examiner*—S. Mulpuri
*Attorney, Agent, or Firm*—Wenderoth, Lind & Ponack

[57] ABSTRACT

One NPN or PNP transistor is formed on a Si single crystal island having a crystal orientation which is the same as that of a Si substrate and formed into an island shape through an insulation and separation layer on the Si substrate so as to form a semiconductor apparatus which has no parasitic junctions.

8 Claims, 22 Drawing Sheets

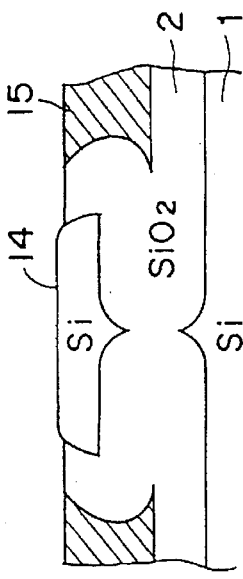
Fig. 1(e)
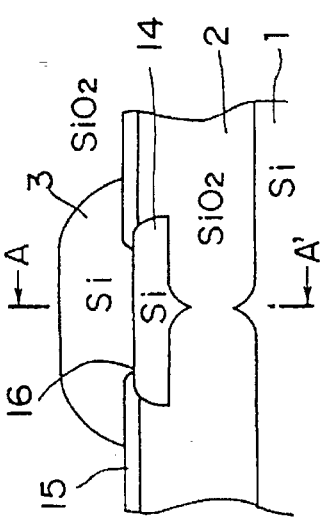
Fig. 1(f)
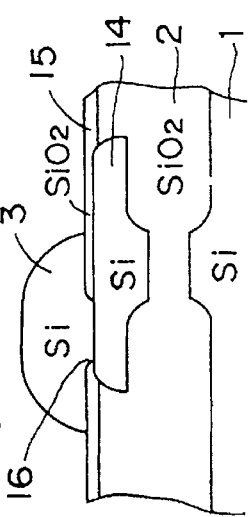
Fig. 1(g)
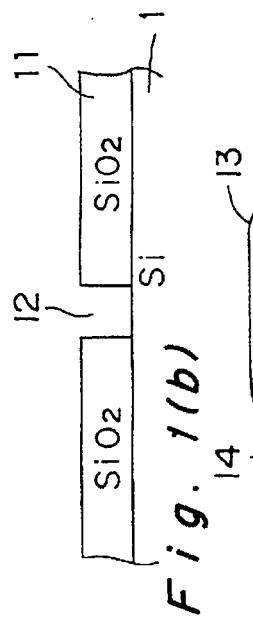
Fig. 1(a)
Fig. 1(b)
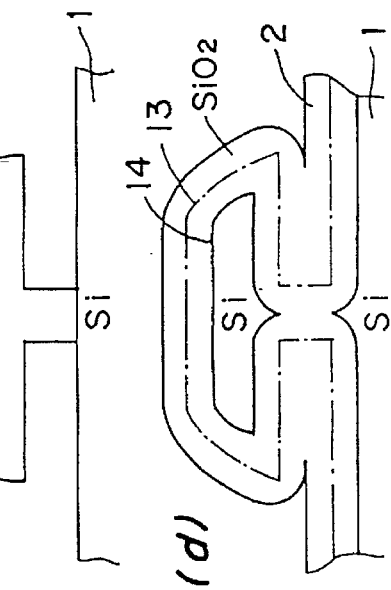
Fig. 1(c)
Fig. 1(d)

Fig. 10(ℓ)
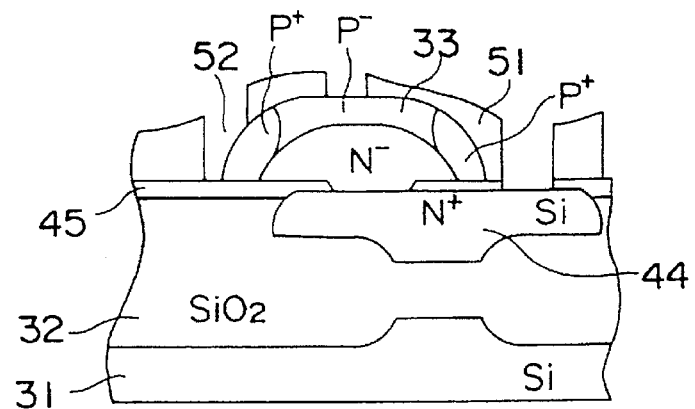
Fig. 10(m)
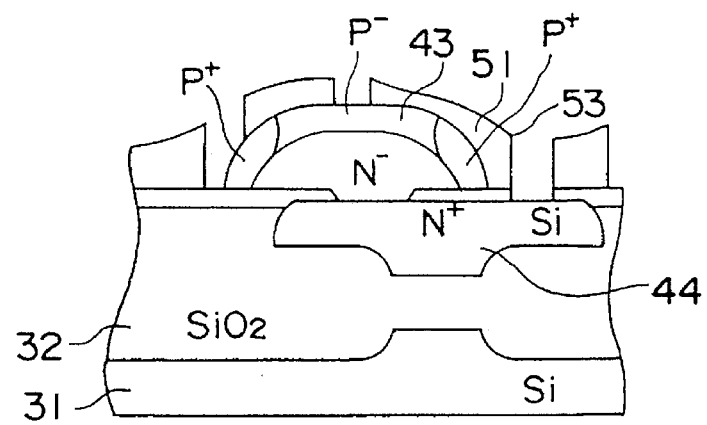
Fig. 10(n)
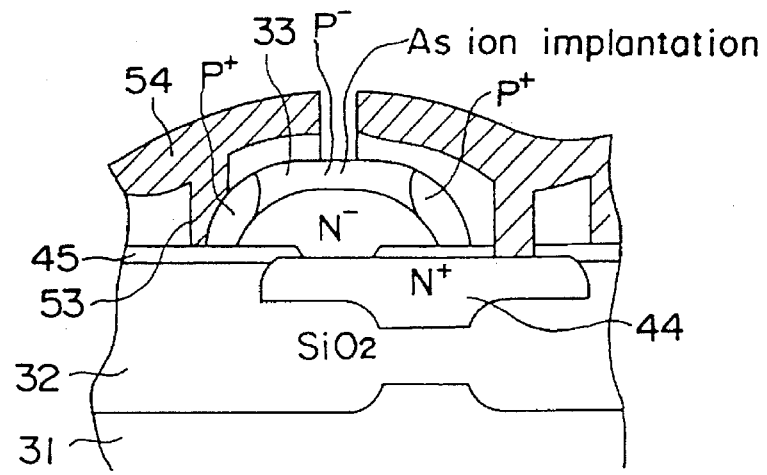

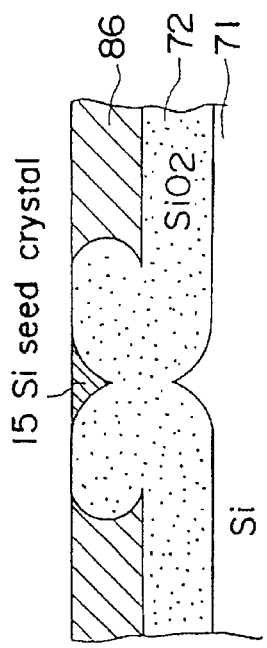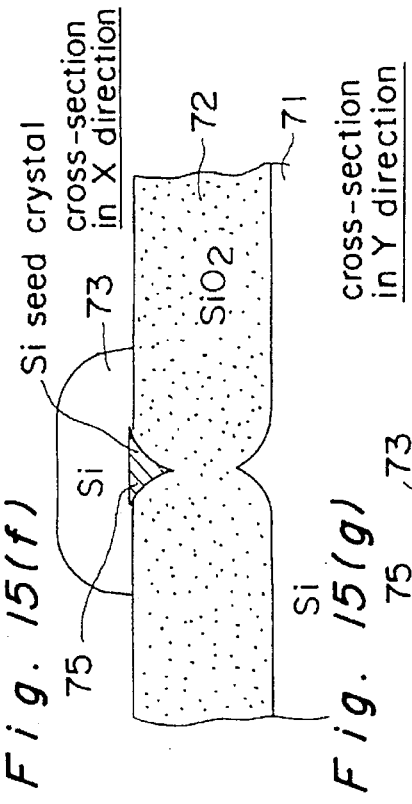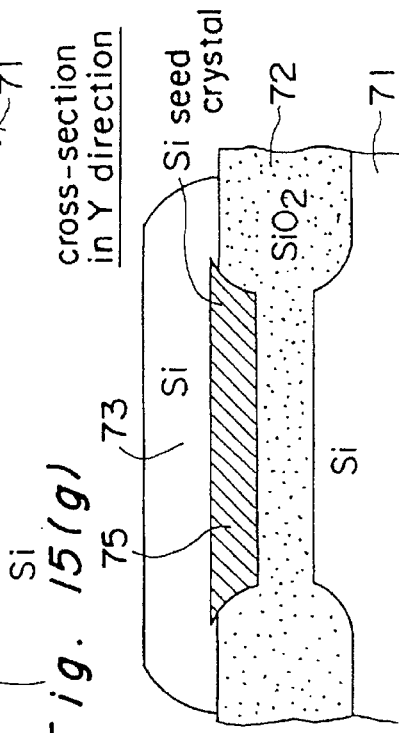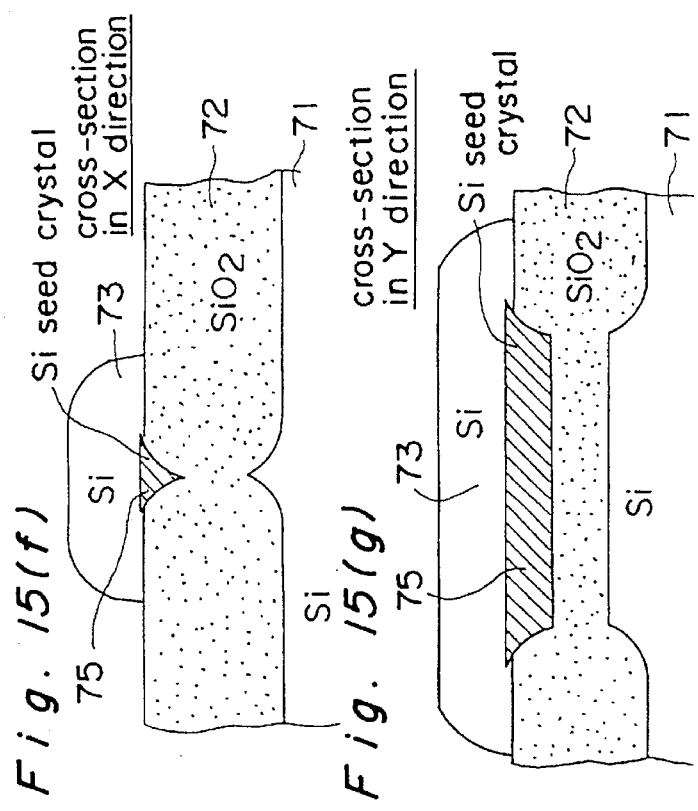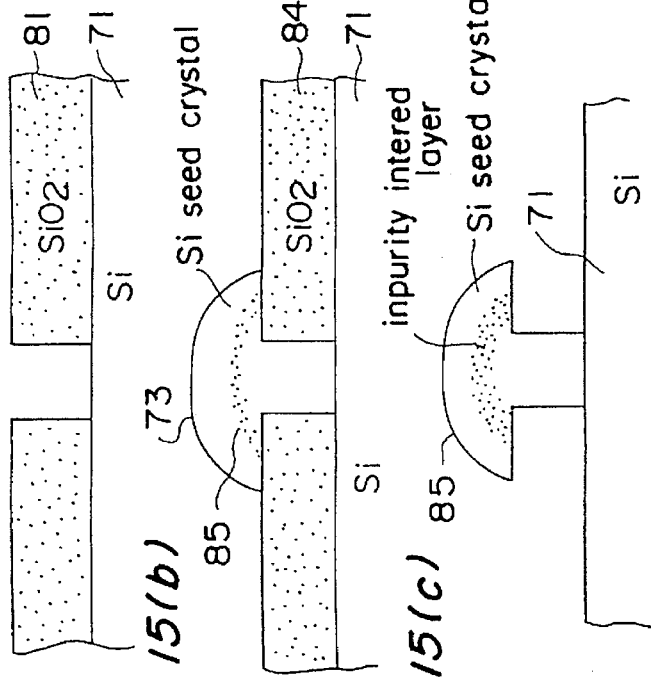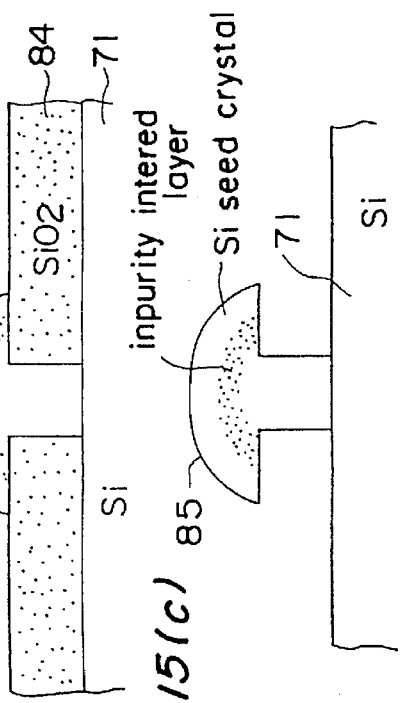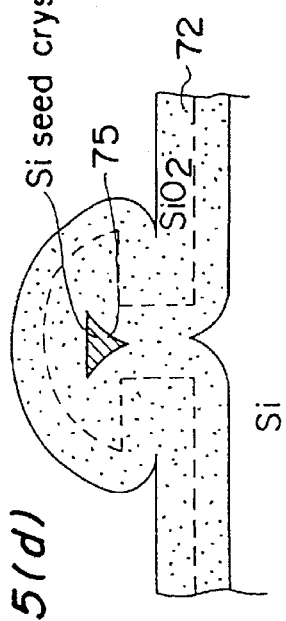

METHOD OF MAKING SEMICONDUCTOR APPARATUS

This application is a division of now abandoned application, Ser. No. 07/963,705, filed Oct. 20, 1992, is now abandoned.

BACKGROUND OF THE INVENTION

The present invention generally relates to a method of making a semiconductor apparatus without a parasitic junction.

A threefold diffusing system as shown in FIG. 20 in the conventionally used semiconductor apparatus had much diffusion of a P⁻ region, the concentration of the P⁻ region was higher than N⁻ region and a part of the P⁻ region had to be made lower in concentration, with a defect that series resistance of a collector became larger. The larger concentration ratio of the base and the emitter was hard to obtain as no room was provided in an impurity profile. As the injecting efficiency of the emitter could not be raised, the gain was small.

In such conventional P-WELL system as shown in FIG. 21, the resistance of a P⁺ region could be lowered, but the concentration of a flush P region was hard to be made larger than a flush N⁺region. The series resistance of the collector was adapted to be lowered with the use of the layer of UP-DOWN ISO. As a P (collector) region was in contact against the flush N⁺ region, the withstand pressure of the collector could not be made high with a defect that the area became larger.

Such conventional SUB-PNP system as in FIG. 22 was the same as the P-WELL system of FIG. 21 except for the collector of the PNP. Although the series of the collector could be lowered by a portion where the flush layer of N⁺ was not provided, with a defect that the collector potential could not be obtained freely as the collector was short in circuit with the SUB.

The above described FIG. 11, FIG. 12 had a defect that parasitic effects were caused if the bias of the surrounding N⁻ EPI was made better. Although FIG. 20, FIG. 21, FIG. 22 could have the NPN provided jointly, difference was considerable in peculiar characters so that NPN / PNP mutually supplementary type was hard to obtained.

SUMMARY OF THE INVENTION

Accordingly, the present invention has been developed with a view to substantially eliminating the above discussed drawbacks inherent in the prior art, and has for its essential object to newly provide an improved semiconductor and a method of making it.

Another important object of the present invention is to provide an improved semiconductor apparatus and a method of making it where individual elements are respectively formed independently and separately, are completely insulated, separated from unnecessary diffusing layers so as to realize independently functional elements so that the speed reduction because of the parasitic capacity is prevented and also, the parasitic effects of latch up because of parasitic elements have been prevented. In accordance with the present invention, the device of a mutually supplementary type can be realized where the NPN transistor and the PNP transistor is in gain conformed, and the contraction of the element area is adapted to be effected with the complete insulation, separation of the PN splicing separation.

In accomplishing these and other objects, according to one preferred embodiment of the present invention, there is provided a semiconductor apparatus where an insulation, separation layer is formed on a Si basic plate, one portion of the above described Si basic plate is epitakicially grown on the insulation separation layer so as to project, form a Si single crystal island having a crystal bearing the same as the above described Si basic plate into an island shape, transistors of NPN or PNP are formed into the Si single crystal island.

The semiconductor apparatus of the present invention has the single crystal island of Si having the same crystal bearing for completely insulating, separating the unnecessary diffusing layers, has individual independent functional elements formed insulatedly, separatedly from the basic plate, each of the functional elements is insulated, separated in its bottom face from the basic plate, with the side faces being respectively separated with insulating materials among them independently.

In order to prevent only one transistor of the NPN, the PNP from changing in its construction with threefold diffusion as the functional element, a N type of single crystal island is formed on the NPN, and a P type of serial crystal island is formed on the PNP. The P type, N type of single crystals are grown crystally while they are being doped with respective equal conductive type or non • dope of crystals are grown, thereafter P type or N type may be provided by ion injection or the like. The standard crystal in this case is formed with the non • dope and the doping operation is effected with high concentration into the N type or the P type with an ion injection.

In the semiconductor apparatus of the present invention composed of such construction as described hereinabove, the single crystal island of the Si is surrounded with insulating materials, so that the parasitic junction can be removed. The N type of single crystal island is formed on the NPN, and the P type of single crystal island is formed on the PNP. N⁺, P⁺ of diffusing layers (collector regions) are provided respectively in the lower portion (standard crystal portion) of each single crystal island, an emitter is provided in the single crystal island upper portion, a base is formed in the central portion from the peripheral portion. The impurities of the base, emitter are adapted to be adjusted in profile independently in NPN, PNP.

The semiconductor apparatus to be obtained in the present invention is formed in the single crystal island of Si with the device being surrounded with insulating materials and has no parasitic junctions, and the parasitic effects are not caused. The parasitic capacity can be reduced and the high speed element high frequency element can be formed. As the gain can be combined with the NPN type transistor with the vertical type of PNP type transistor being formed, it may be made into a complementary type. The size of the seed window with the degree of the freedom being provided in length instead of width is changed so that the single crystal island of the size necessary for the element formation can be formed, a extrinsic base with the surrounding portion of the base being high in concentration is formed, $r_{bb}$, can be reduced so as to improve the high frequency property and the low noises property, and the collector is put into contact from the standard crystal portion so that the low series resistance can be obtained.

Also, an IIL gate element of the present invention forms an insulation separation layer on the Si basic plate, one portion of the above described Si basic plate is grown epitaxially on the insulation separation layer so as to project, form the Si single crystal island, having a crystal bearing the same as the above described Si basic plate, into an island shape, and a P⁺ layer, a N layer, a P layer, a N⁺ layer are laminated sequentially from the lower portion to the upper portion in the Si single crystal island.

Accordingly, the semiconductor element of the present invention is formed with an I²L gate element of high speed as vertical type construction where the emitter of the a PNP type transistor is opposed evenly to the base. The semiconductor apparatus of the present invention has the single crystal island of the Si having the same crystal bearing for completely insulating, separating the unnecessary diffusing layers, has individual independent functional elements formed insulatedly, separatedly from the basic plate, each of the functional elements is insulated, separated in its bottom face from the basic plate, with the side faces being respectively separated with insulating materials among them independently.

In order to prevent only one transistor of the NPN, the PNP from changing in its construction with the threefold diffusion as the functional element, a N type of single crystal island is formed on the NPN, and a P type of crystal islands are formed on the PNP. The P type, N type of single crystals are grown crystally while they are being doped with respective equal conductive type or non • dope of crystals are grown, thereafter P type or N type may be provided by ion injection or the like. The standard crystal in this case is formed with the non • dope and the doping operation is effected with high concentration into the N type or the P type.

In the semiconductor apparatus of the present invention composed of such construction as described hereinabove, the single crystal island of the Si is surrounded with insulating materials, so that the parasitic junction can be removed. The N type of single crystal island is formed on the NPN, and the P type of single crystal island is formed on the PNP. N⁺, P⁺ of diffusing layers (collector regions) are provided respectively in the lower portion (standard crystal portion) of each of single crystal islands, an emitter is provided on the short crystal island upper portion, a base is formed in the central portion from the peripheral portion. The impurities of the base, emitter are adapted to be adjusted in profile independently in NPN, PNP.

Further, as the gate element of the present invention realizes a vertical type of PNP type transistor by the emitter of the a PNP type injector through the doping of the P⁺ into a primary standard crystal. As influences which lowers the gain of rebonding or the like on the surfaces are small and the controlling in the thickness direction (BASE width) is effected, the control property is better. The thickness can be reduced so that high gain can be obtained. As an injecting operation can be effected evenly from a PNP transistor into the base of the NPN type of transistor, dependence by the position of the F/O is reduced.

The IIL gate element to be obtained in the present invention is formed on the single crystal island with the device being formed by the single crystal island of Si surrounded with insulating materials and has no parasitic junctions, so that the parasitic effects are caused. The parasitic capacity can be reduced and the high speed element high frequency element can be formed. As the gain can be combined with the NPN type transistor with the vertical type of PNP type transistor being formed, it may be made into a complementary type. The size of the seed window with the degree of freedom being provided in length instead of width is changed so that the single crystal island of the size necessary for the element formation can be formed, an extrinsic base with the surrounding portion of the base being high in concentration is formed, $r_{bb}$, can be reduced so as to improve the high frequency property and the low noises property, and the collector is put into contact from the standard crystal portion so that the low series resistance can be obtained.

Also, the high gain of the PNP transistor is obtained, the electron injecting operation into the NPN base is evenly effected from the PNP so as to reduce the positional dependence of the F/O. As the circumference of the NPN base is surrounded with an insulting film, CEB becomes smaller as compared with the conventional P/N splicing so that high speed processing operation is effected, and further, the I²L gate area can be reduced.

Further, the present invention is adapted to have no parasitic capacity with respect to the basic plate the resistance elements, the capacitor elements to be formed on the semiconductor basic plate, and to contract the area of the capacitor elements. Namely, when the individual elements are formed on the semiconductor basic plate, are completely insulated, separated from unnecessary diffusing layers so as to realize independent electrically-driven elements so that speed reduction because of the parasitic capacity is prevented and also, the parasitic effects of latch up because of parasitic elements are prevented.

A semiconductor passive element of the present invention is provided with a Si basic plate, an insulation separation layer formed on the Si basic plate, a Si single crystal having a crystal bearing the same as the above described Si basic plate projected into an island shape on the insulation separation layer, a dielectric layer formed on the Si single crystal island, one side terminal for capacity use connected with the above described Si single crystal island, and the other side terminal for capacity use connected with the top portion of the above described dielectric layer.

Also, another semiconductor passive element of the present invention is formed into an insulating separation layer on the Si basic plate, one portion of the above describes Si basic plate is epitakicially grown on the insulation separation layer so as to project into an island shape the Si signal crystal island having the crystal bearing the same as the above described Si basic plate, a dielectric layer is formed on the Si single crystal island so as to connect a terminal for capacity use respectively with the top portion of the dielectric layer and the above described Si single crystal island.

Accordingly, the semiconductor electrically-driven element of the present invention has an insulation separation layers, has them respectively independently formed, has the single crystal island of Si the same crystal bearing for completely insulating, separating the unnecessary diffusing layers, has individual independent passive elements insulated, separated from the basic plate, each of the passive elements is insulated, separated in its bottom face from the basic plate, with the side faces being respectively separated with insulating materials among them independently.

Also, as a functional element, the P type, N type of single crystals of the Si single crystal island are grown crystally while they are being doped with respective equal conductive type or non • dope of crystals are grown, thereafter the P type or the N type may be provided by ion injection or the like. Either method may do. The standard crystal in this case is formed with the non • dope and the doping operation is effected with high concentration into the N type or the P type.

As the semiconductor passive element of the present invention composed of such construction as described hereinabove has the single crystal island of Si surrounded with insulating materials, the parasitic junction can be removed.

Accordingly, the resistance element of the present invention is better in high frequency characteristics as the resistance has no parasitic PN splicing. Temperature coefficient can be changed by change in the impurity dope amount in the single crystal. Further, change in the resistance value can be coped with impurity dope amount or with the shape of the single crystal island.

Also, as the capacitor element uses the single crystal floated from the Si basic basic plate for the lower electrode, the low resistance can be obtained as compared with the poly Si, the frequency characteristics become better, the contraction of the area can be effected with the bump shape of the groundwork.

BRIEF DESCRIPTION OF THE DRAWINGS

These and other objects and features of the present invention will become apparent from the following description taken in conjunction with the preferred embodiment thereof with reference to the accompanying drawings, in which;

FIG. 1, (a) to (g), is a flow chart showing a making order of forming a Si single crystal island of a semiconductor apparatus of the present invention;

FIG. 15, (a) to (g), is a flow chart showing a making order of an element of FIG. 4;

DETAILED DESCRIPTION OF THE INVENTION

Figure 2A:
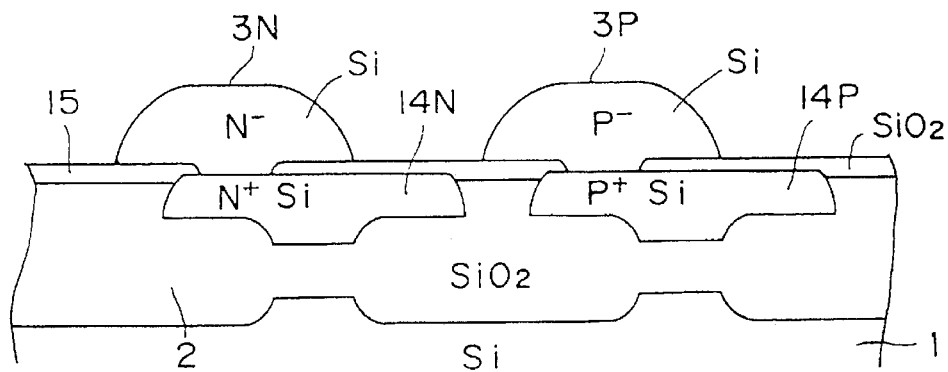
FIG. 2, (a) to (m), is a flow chart of making orders (a) and (m) of a NPN transistor and a PNP transistor with the use of the Si crystal crystal island formed in FIG. 1.

Before the description of the present invention proceeds, it is to be noted that like parts are designated by like reference numerals throughout the accompanying drawings.

A semiconductor apparatus in accordance with the present invention will be described hereinafter in detail with reference to each embodiment shown in the drawings.

(Embodiment 1)

A semiconductor apparatus shown in FIG. 3, FIG. 4, FIG. 5, FIG. 6 is composed of a Si basic plate 1, an insulation separation layer 2 formed on the Si basic plate, a Si single crystal island 3 having a crystal bearing the same as the above described Si basic plate projected, formed into an island shape on the insulation separation layer, a transistor 4 of a NPN (FIG. 3, FIG. 4) or a PNP (FIG. 5, FIG. 6) formed on the Si single crystal island. Reference numeral 5 is a base, reference numeral 6 is an emitter, reference numeral 7 is a collector.

The making step of the NPN type transistor and the PNP transistor will be described with reference to FIG. 1 and FIG. 2.

In FIG. 1 (a), a $SiO_2$ layer 11 of 1 micron in thickness is formed on the surfaces of the Si basic plate 1 with Si thermal oxidation so as to form a window 12 on a $SiO_2$ layer 11 with a seed window P.R./P.E. The Si basic plate 1 is epitaxially grown through the above described window 12 so as to form a Si standard crystal 13 having a crystal bearing the same as the above described Si basic plate projected into an island shape on the $SiO_2$ layer from the window 12 as shown in FIG. 1(b), thereafter impurities 14 of $As^+$ N type or $B^+$ P type are introduced with an ion injection into the Si standard crystal 13.

The above described $SiO_2$ 11 is peeled off with an etching as shown in FIG. 1(c) so that only the above described Si standard crystal 13 may be projected into a head shape from the Si basic plate 1 and may remain. The Si basic plate 1 and the Si standard crystal 13 exposed in this manner is Si thermally oxidized again and the central core portion of the Si standard crystal 13 is left as a seed grain 14 as shown in FIG. 1(d). In this condition, the insulation separation layer 2 of the $SiO_2$ is formed on the whole circumference of the seed grain 14 and the whole surface of the Si basic plate.

Spin on glass (SOG) 15 is applied on the top face of the above described insulation separation layer 2. The top portion of the insulation separation layer 2 surrounding the seed grain 14 projected into the head shape with a levelled etch back and the SOG 15 applied on it are removed after annealing so as to level the surfaces. As shown in FIG. 1(e), the seed grain 14, the insulation separation layer 2 on the sideway circumference and the SOG 15 on the further external periphery become exposed as one plane face.

Thereafter, the above described seed grain 14 is epitaxially grown through the window 16 of the $SiO_2$ layer 15 formed with Si thermal oxidation on the surface. The Si single crystal island 3 projected into an island shape is formed on the top face of the above described insulation separation layer 2 as shown in FIG. 1(f) and FIG. 1 (g) with an A–A' sectional view of FIG. 1(f). The Si single crystal island 3 is a single crystal of the Si epitaxially grown with the seed grain 14 from the Si basic plate 1 as a seed, and has a crystal bearing the same as the Si basic plate 1. The Si seed grain 14 injects the B⁺ ion into the si single crystal island formed on it so as to form into a N⁻ type or injects the As⁺ ion so as to form into a P⁻ type. FIG. 2 through FIG. 5 show a case where the N⁻ type Si crystal island 3N and the P⁻ type Si single crystal island 3P are provided on one Si basic plate 1 as shown in FIG. 2(a) so as to make the NPN transistor and the PNP transistor at the same time.

Figure 2B:
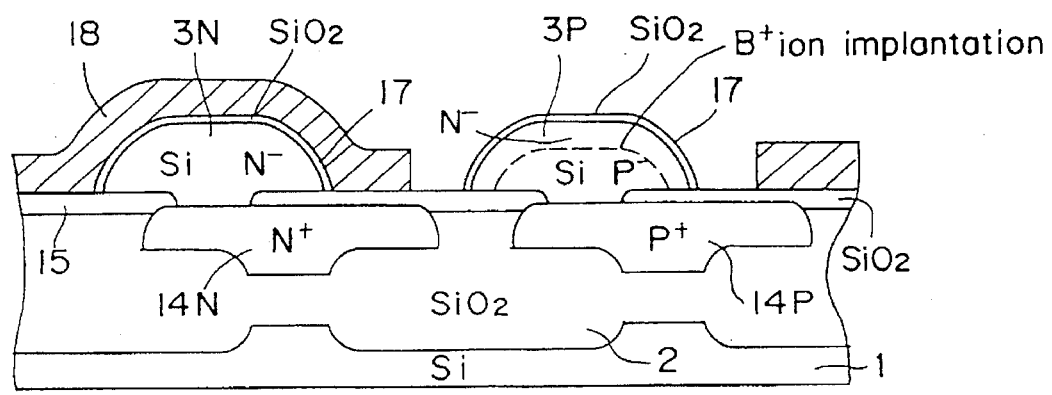
Figure 2C:
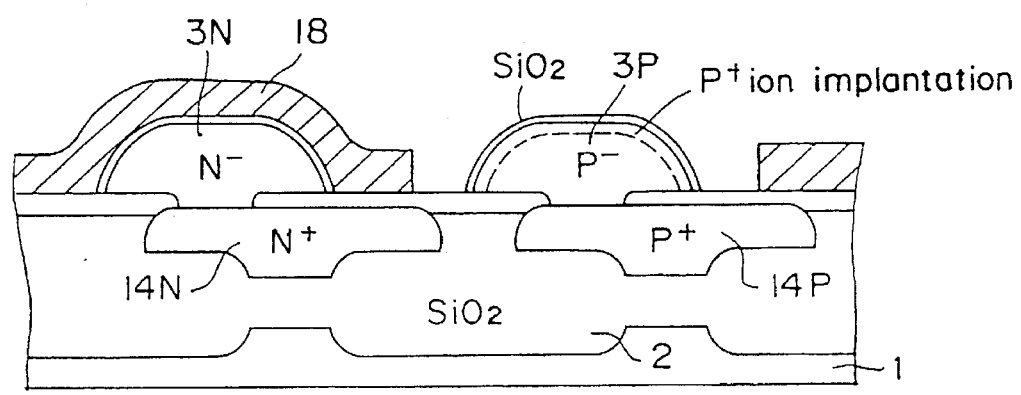

The SiO₂ layer 17 is formed with thermal oxidization on the surface of the Si single crystal island 3 as shown in FIG. 2(b) so as to coat the N type Si single crystal island 3N with resist 18. Thereafter, a B⁺ ion is injected into the given position of the P type Si single crystal 3P through the SiO₂ layer 17 with masking on the P type Si single crystal island 3P so as to form a N⁻⁻ layer on the P⁻ layer of the Si. Continuously the P⁺ ion is injected into the N⁻ layer as shown in FIG. 2(c).

Figure 2D:
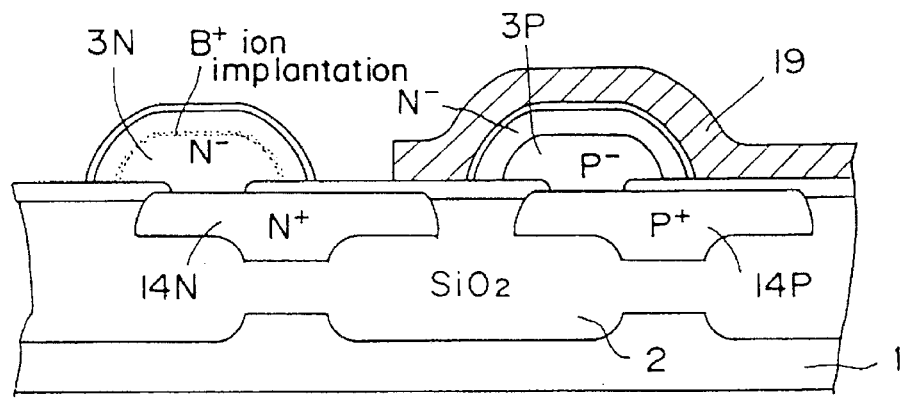

Similarly, as shown in FIG. 2(d), a B⁺ ion is injected into the given position of the N type Si single crystal 3N through the SiO₂ layer 17 with masking on the N type Si single crystal island 3N so as to form a P⁻⁻ layer on the N⁻ layer of the Si.

Figure 2E:
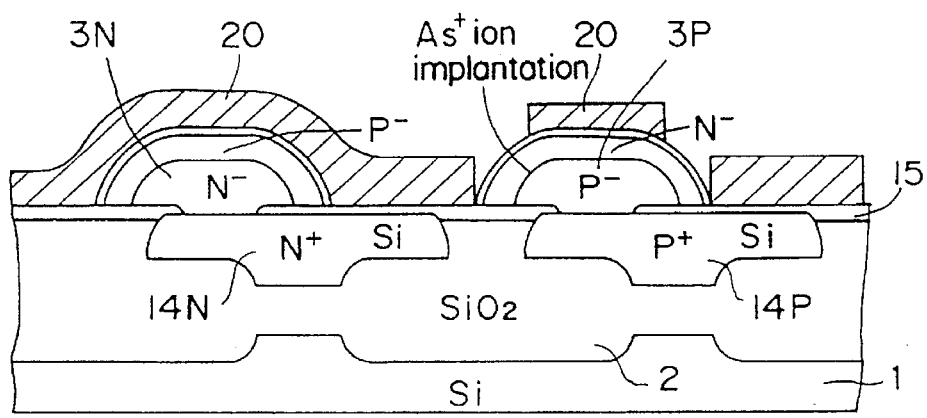
Figure 2F:
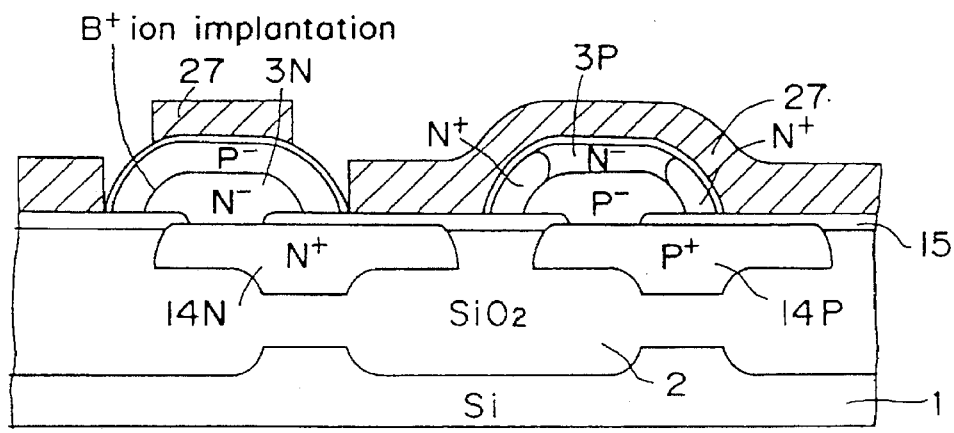
Figure 2G:
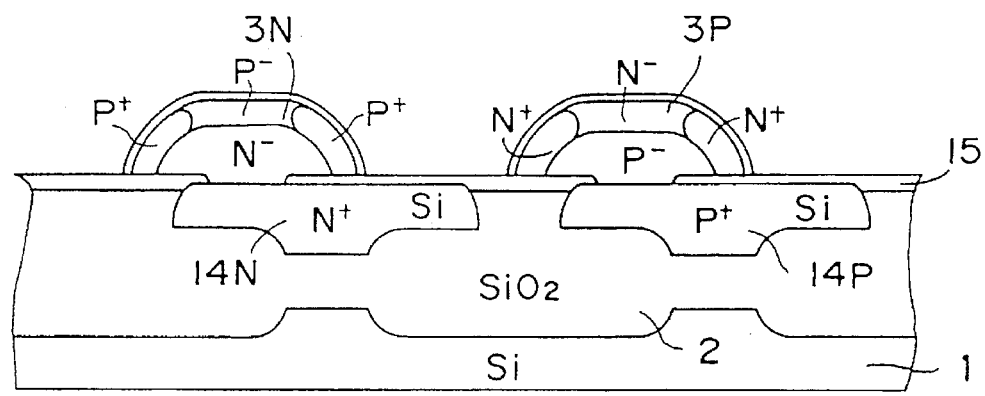

After the whole portion of the N type of Si single crystal island 3N and one portion on the top face of the P type single crystal island 3P are coated with resist 20 as shown in FIG. 2(e), an As⁺ ion is injected into both the side portions of the N⁻ layer of the P type Si single crystal island 3P so as to form both the side portions of the N⁻ layer on the N⁺ layer. After the whole portion of the P type of Si single crystal island 3P and one portion on the top face of the N type Si single crystal island 3N are coated with resist 27 as shown in FIG. 2(f), a BF⁺ ion is injected on both the side portions of the P⁻ layer of the N type Si single crystal island 3N so as to form both the side portions of the P⁻ layer onto the P⁺ layer. Thereafter, the whole shown in in FIG. 2(g) is annealed for thirty minutes with a N₂ atmosphere of 900° C.

Figure 2H:
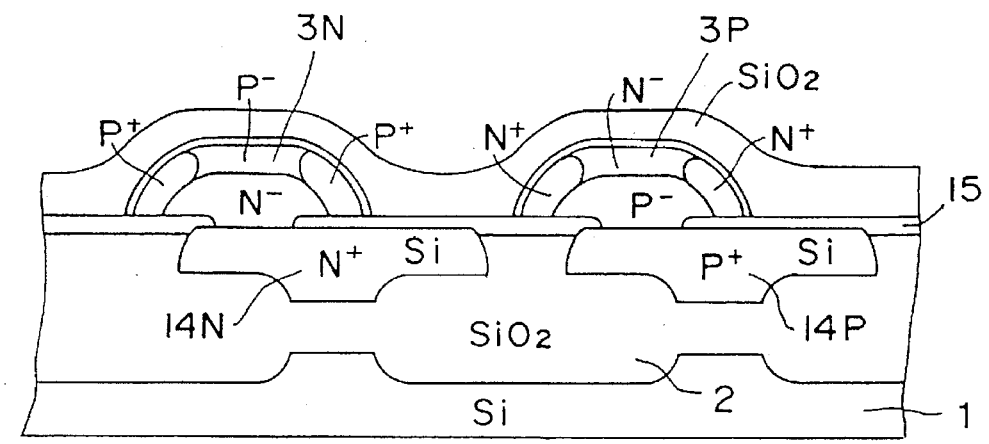
Figure 2I:
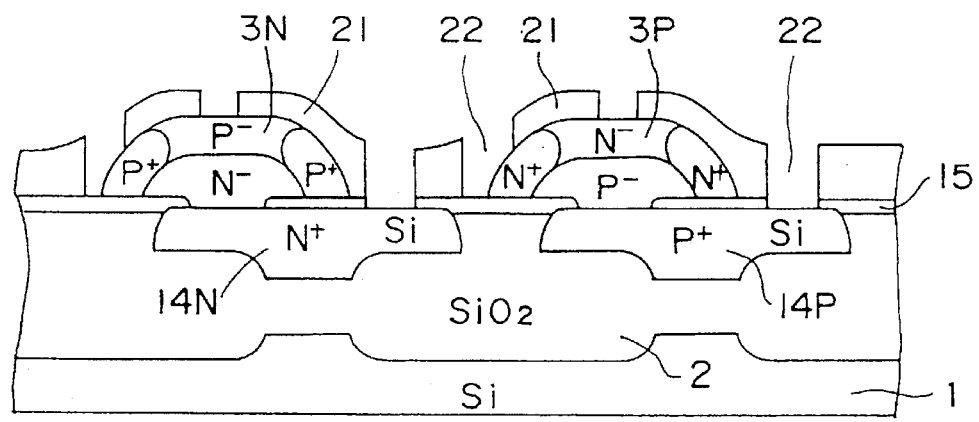
Figure 2J:
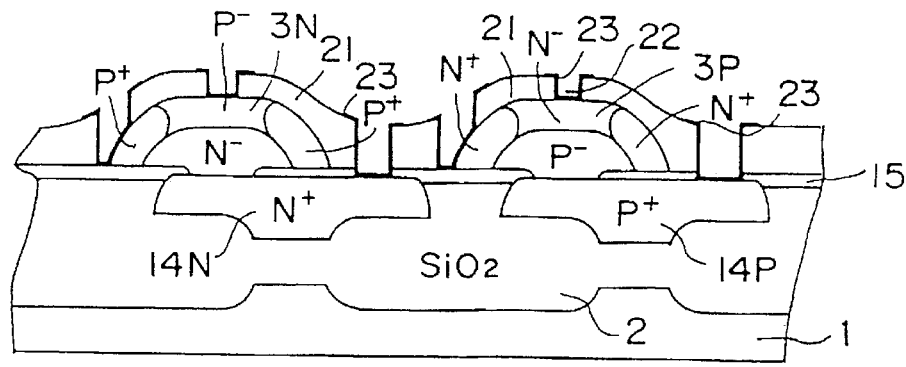

A CVDSiO₂ layer 21 is formed on the whole surfaces as shown in FIG. 2(h) so as to remove one portion into the CVDSiO₂ layer 21. As shown in FIG. 2(i), a hole 22 of a contact is drilled. A poly Si23 is formed on the surface of the SiO₂ layer 21. As shown in FIG. 2(j), one portion of the poly Si is removed and is separated.

Figure 2K:
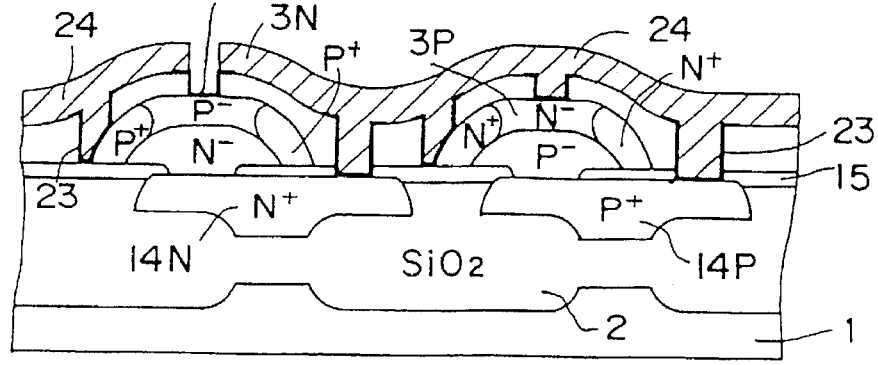
Figure 2L:
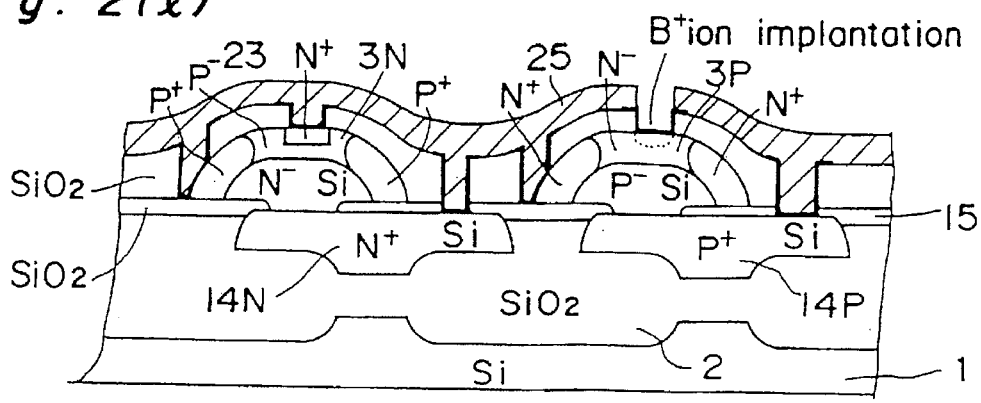

As shown in FIG. 2(k), the whole is coated with resist 24 except for the poly Si hole of top face one portion of the N type Si single crystal island 3N, an As ion is thrown into the P⁻ layer of the N type Si single crystal island 3N so as to form the N⁺ layer on the top portion of the P⁻ layer. Similarly, as shown in FIG. 2(l), the whole is coated with the resist 25 except for the poly Si hole of one portion of the top face of the P type of Si single crystal island 3P so as to throw the B⁺ ion into the N⁻ layer of the P type Si single crystal island 3P for forming the P⁺ layer on the top face of the P⁻ layer.

Figure 2M:
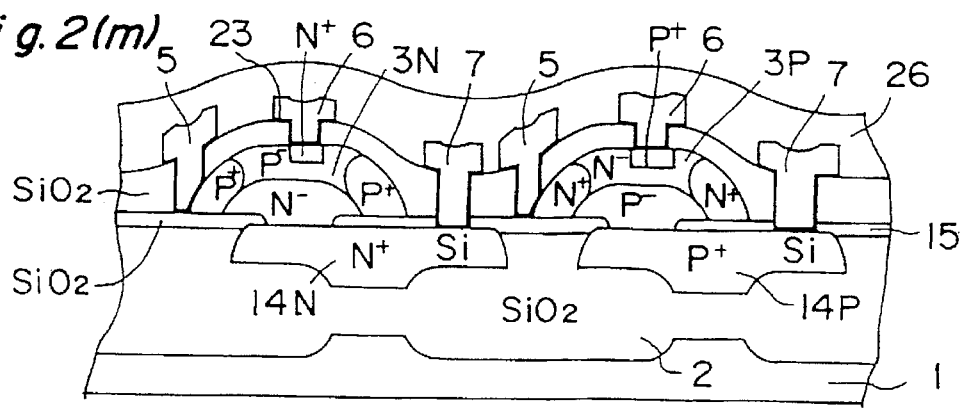
Figure 3:
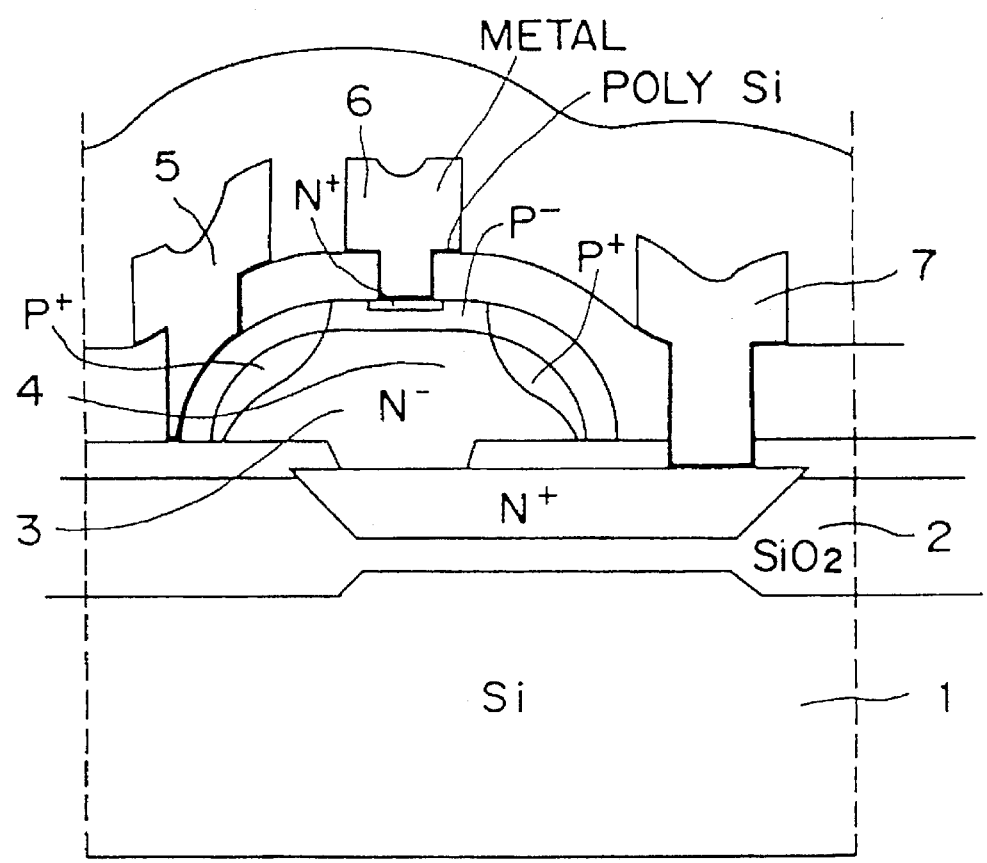
FIG. 3 is a sectional view of a NPN transistor made at a step of FIG. 2.
Figure 4:
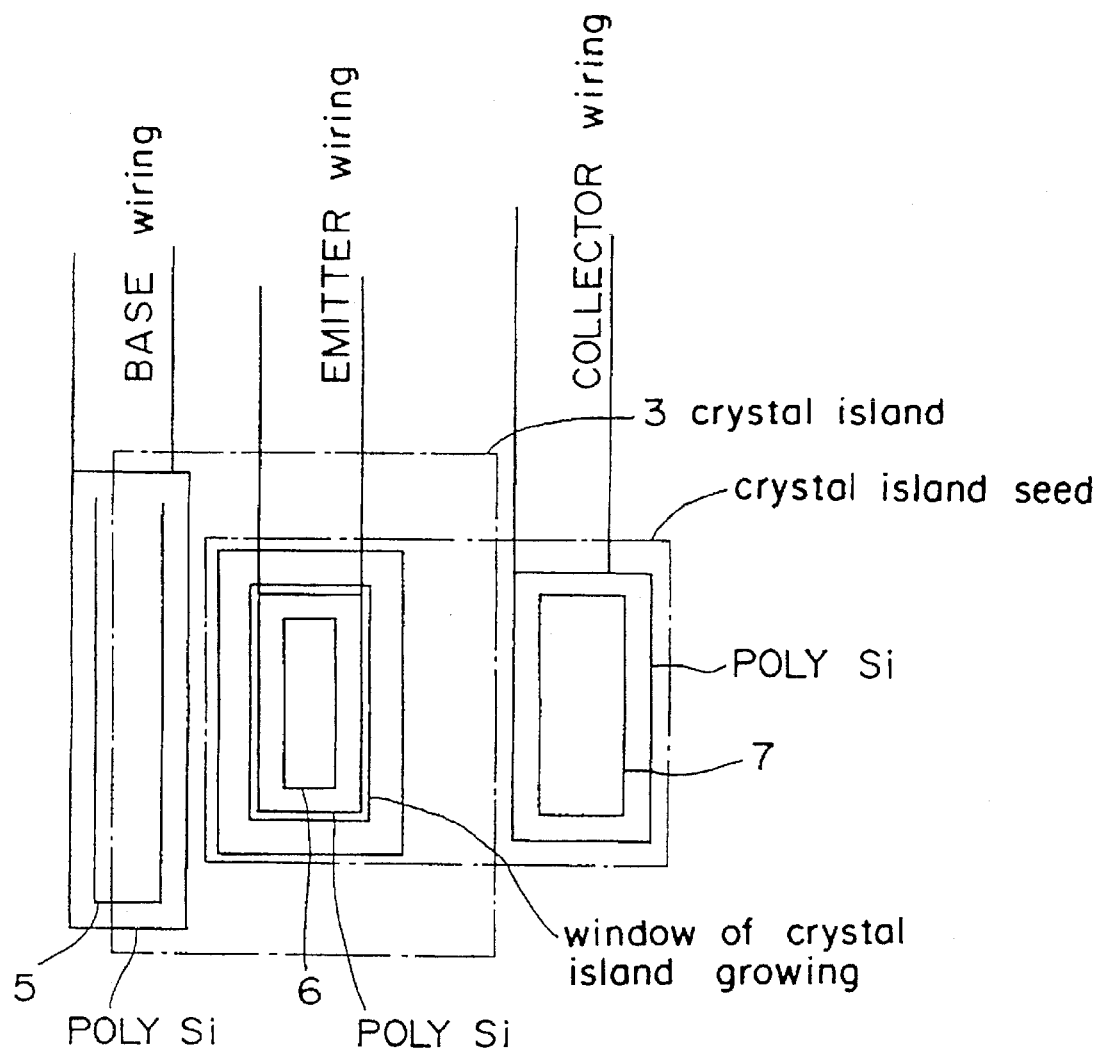
FIG. 4 is a plan view of a NPN transistor of FIG. 3.
Figure 5:
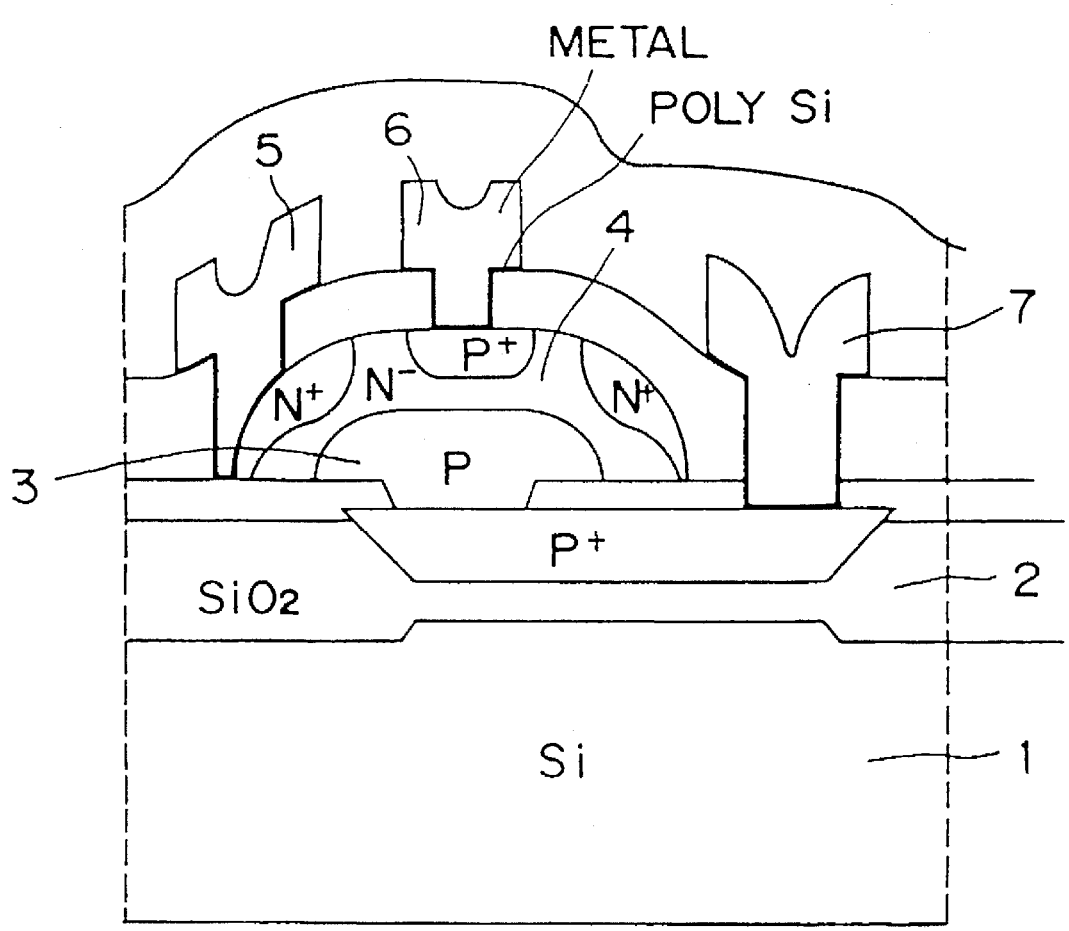
FIG. 5 is a sectional view of a PNP transistor made at a step of FIG. 2.
Figure 6:
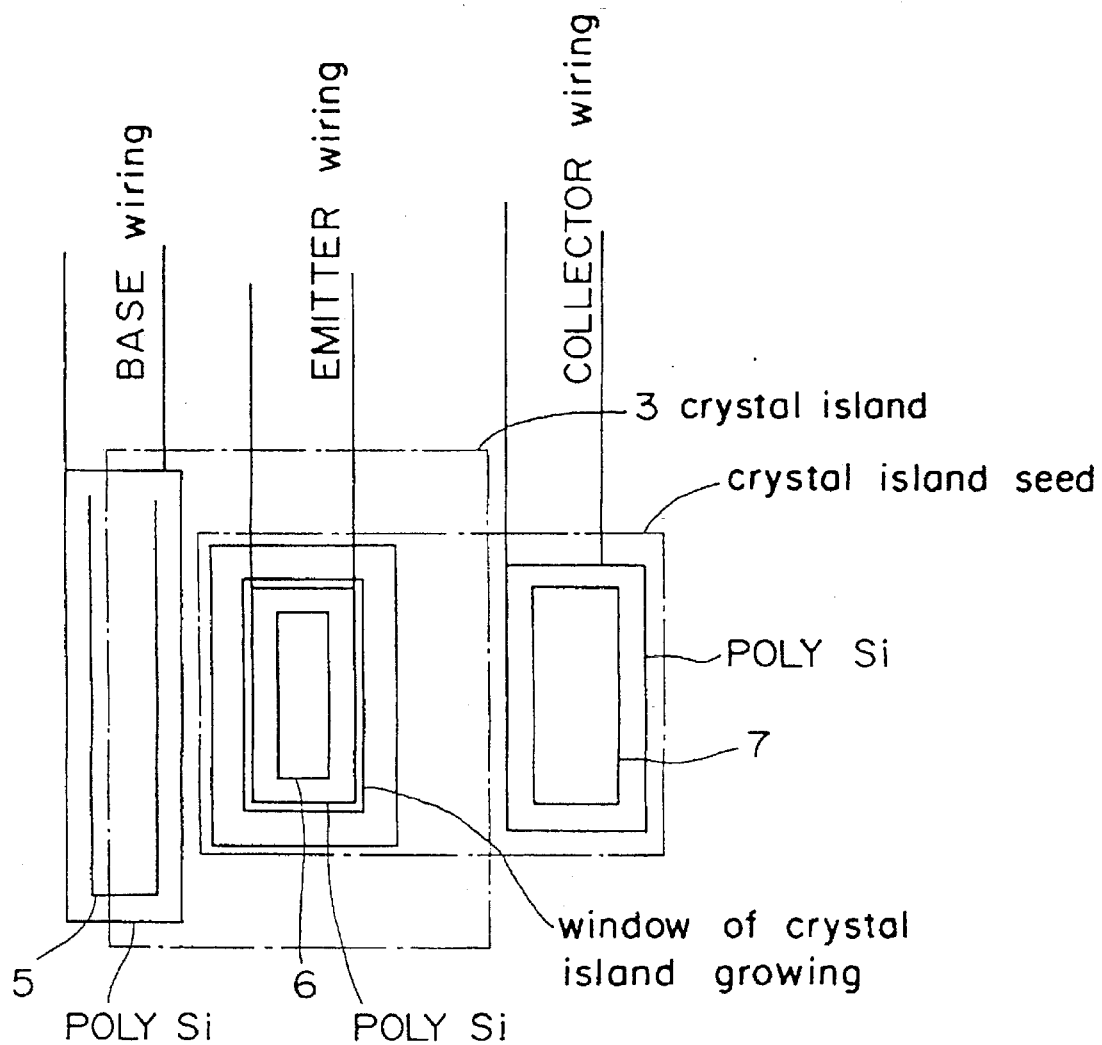
FIG. 6 is a plan view of a PNP transistor of FIG. 5.

Thereafter, metals 5, 6, 7 are inserted into the above described hole 22. Metal wiring is formed into the hole 22 so as to form the wirings of the base, emitter, the collector, and finally, a passivation 26 is provided as shown in FIG. 2(m). The NPN type transistor and the PNP type transistor can be made at the same time as shown in FIG. 3(n), and FIG. 5 in this manner.

The semiconductor apparatus can be composed of a single Si basic plate, an insulation separation layer formed on the Si basic plate, two Si single crystal islands or more having a crystal bearing the same as the above described Si basic plate projected into the island shape respectively on the insulation separation layer, a NPN transistor formed on one island of the Si single crystal island, and a PNP transistor formed on the other island of the Si single crystal island.

A semiconductor apparatus obtained by such making step as described hereinabove can contract the element area by the insulation separation, for example, can reduce by 62% as compared with the conventional product in the NPN type and also, can reduce by 77% as compared with the conventional product in the PNP type.

As is clear from the foregoing description, the semiconductor apparatus in the present embodiment is formed on the single crystal island of Si with the device being surrounded with insulating materials and has no parasitic junctions, so that the parasitic effects are not caused. The parasitic capacity can be reduced. As the gain can be combined with the NPN type transistor with the vertical type of PNP transistor being formed, it may be made into a complementary type. The size of the seed window (degree of freedom being provided in length instead of width) is changed so that the single crystal island of the size necessary for the element formation can be formed, or an extrinsic base with the surrounding portion of the base being high in concentration is formed, $r_{bb}$, can be reduced so as to improve the high frequency property and the low noise property, and the collector is put into contact from the standard crystal portion so that the low series resistance can be obtained. The high gain of the PNP transistor is obtained, and the electronic injection into the NPN base is effected evenly from the PNP so as to reduce the positional dependence of the F/O. As the circumference of the NPN base is surrounded with an insulating film, the CEB is made smaller as compared with the conventional P/N splicing so that higher speed processing operation can be effected.

(Embodiment 2)

Figure 7:
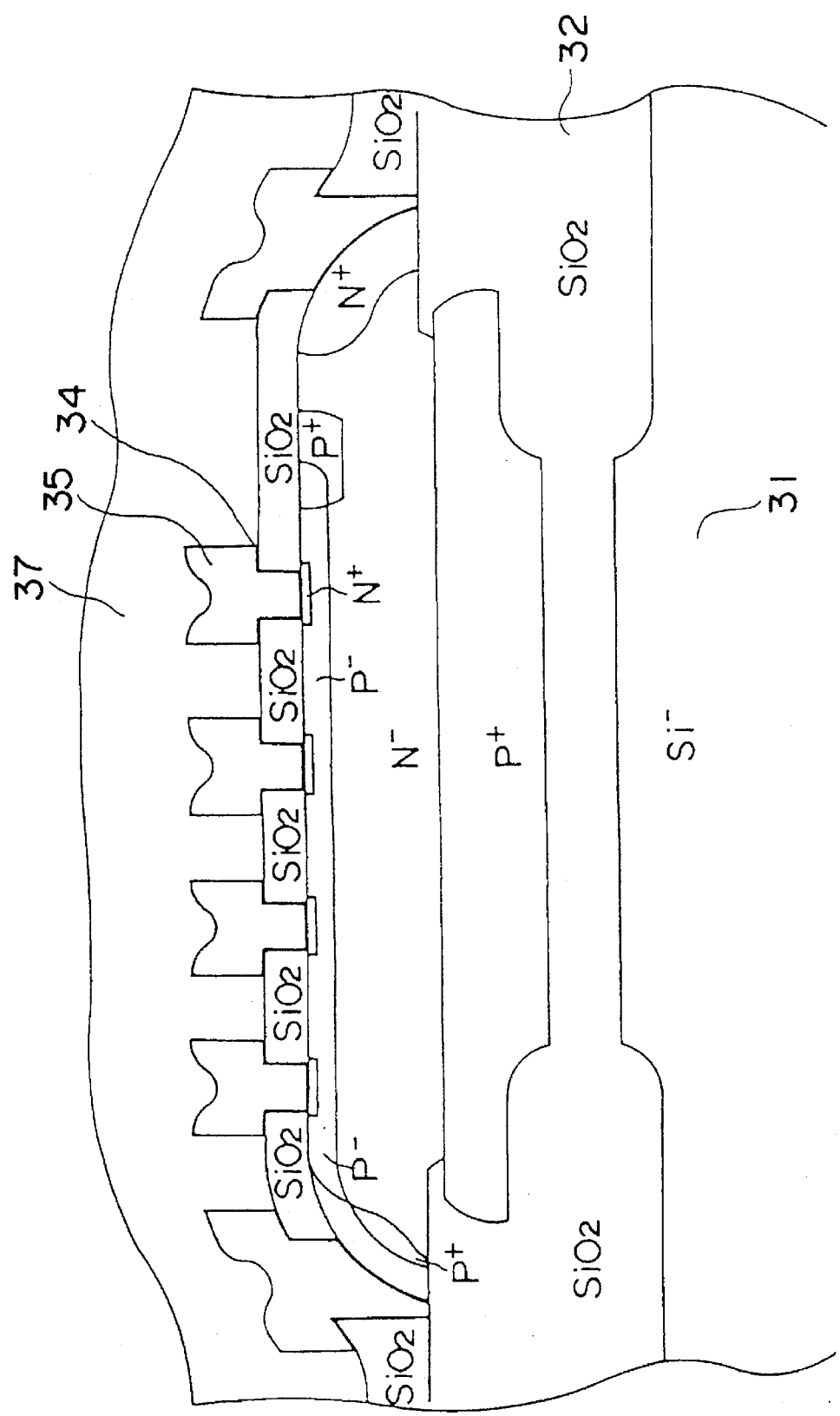
FIG. 7 is a sectional view showing a first embodiment of a semiconductor resistance element of the present invention.
Figure 8:
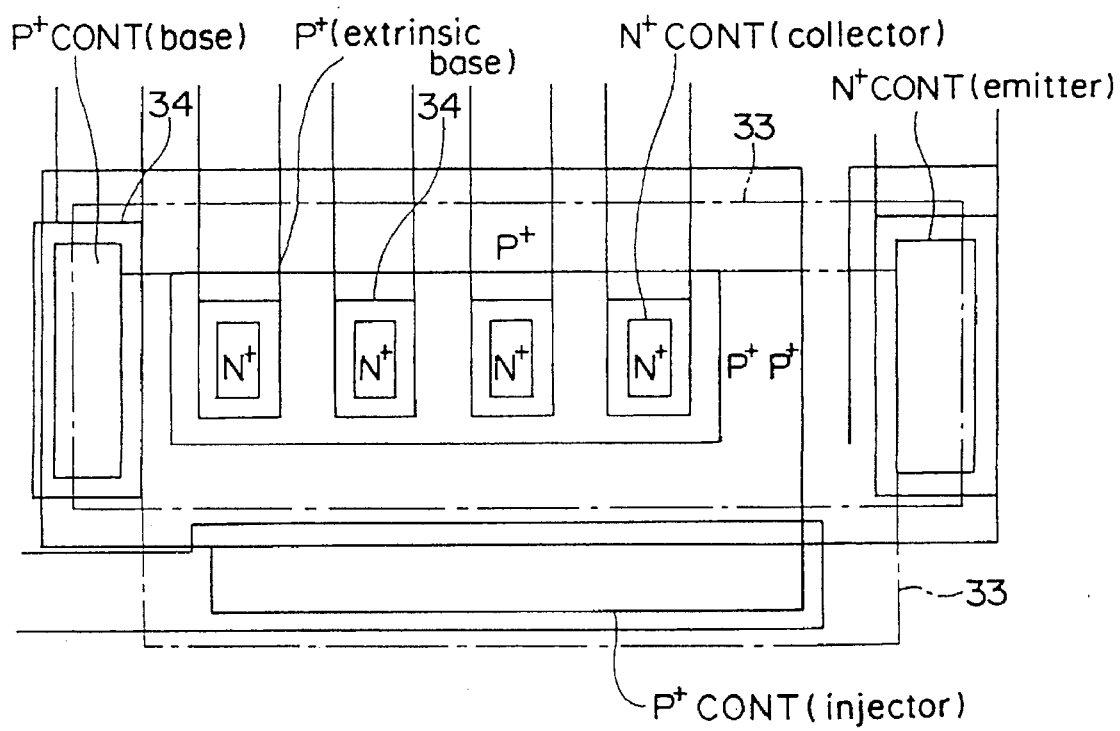
FIG. 8 is a sectional view showing a second embodiment of a semiconductor resistance element of the present invention.
Figure 9:
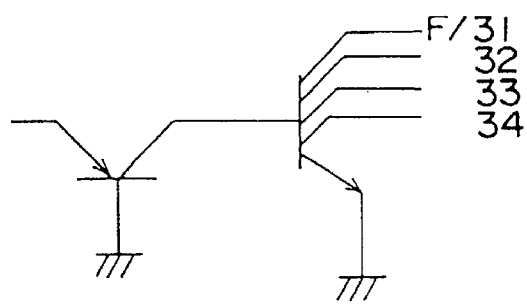
FIG. 9 is a sectional view showing a first embodiment of a semiconductor capacitor element of the present invention.

The IIL gate elements shown in FIG. 7, FIG. 8, FIG. 9 are composed of a circuit shown in FIG. 9. It is provided, as contraction, with a Si basic plate 31 of FIG. 7, FIG. 8, an insulation separation 32 layer formed on the Si basic plate, a Si single crystal island 33 having crystal bearing the same as the above described Si basic plate projected, formed into an island shape on the insulation separation layer 32, a P³⁰ layer, a N layer, a P layer, a N⁺ layer laminated sequentially to the upper portion from the lower portion in the Si single crystal island 33. In the drawing, reference numeral 34 is a poly Si, reference numeral 35 is a metal terminal, reference numeral 37 is a passivation.

A making step of the IIL gate element will be described in FIG. 10.

Figure 10A:
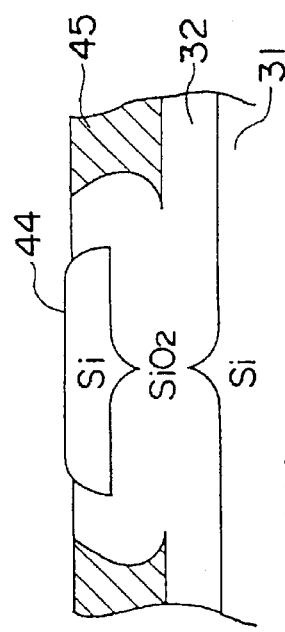
FIG. 10, (a) to (n), is a sectional view showing a second embodiment of a semiconductive capacitor element of the present invention.
Figure 10B:
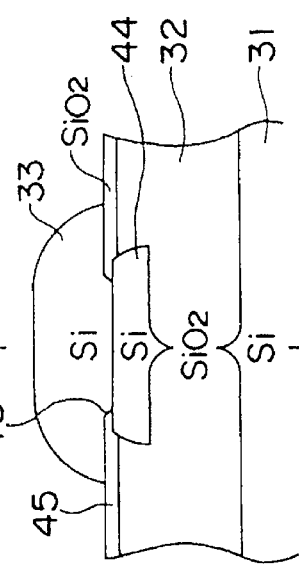

In FIG. 10(a), a SiO₂ layer 41 of 1 micron in thickness is formed with Si thermal oxidation on the surfaces of the Si basic plate 31 so as to form a window 42 on a SiO₂ layer 41 with a seed window P.R/P.E. The Si basic plate 1 is epitaxially grown through the above described window 12 so as to form a Si standard crystal 43 having a crystal bearing the same as the above described Si basic plate projected into an island shape on the SiO₂ layer from the window 42 as shown in FIG. 10(b), thereafter impurities 44 of B⁺ P type are introduced with an ion injection into the Si standard crystal 43.

The above described SiO₂ layer 41 is peeled off with an etching as shown in FIG. 10 (c) so that only the above described Si standard crystal 43 may projected into a head shape from the Si basic plate 31 and may remain. The Si basic plate 31 and the Si standard crystal 43 exposed in this manner are Si thermally oxidized again and the central core portion of the Si standard crystal 43 is left as a seed grain 44 as shown in FIG. 10(d). In this condition, the insulation separation layer 32 of the SiO₂ is formed on the whole circumference of the seed grain 44 and the whole surface of the Si basic plate.

Figure 10E:
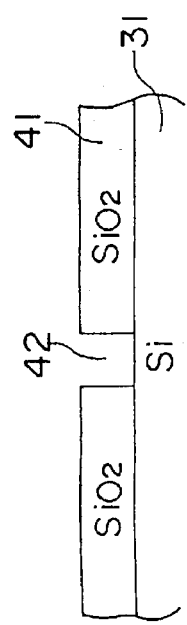

Spin on glass (SOG) 45 is applied on the top face of the above described insulation separation layer 32. The top portion of the insulation separation layer 32 surrounding the seed grain 44 projected into the head shape with a levelled etch back and the SOG 45 applied on it are removed after annealing so as to level the surfaces. As shown in FIG. 10(e), the seed grain 44, the insulation separation layer 32 on the sideway circumference and the SOG15 on the further external periphery become exposed as one plane face.

Figure 10F:
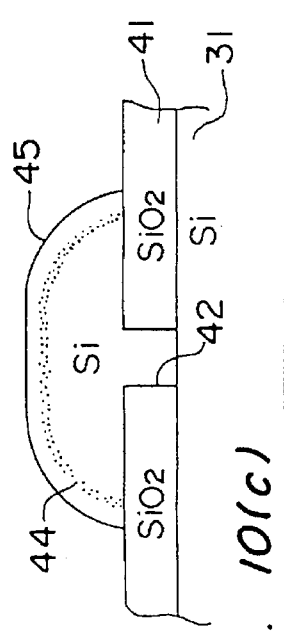
Figure 10G:
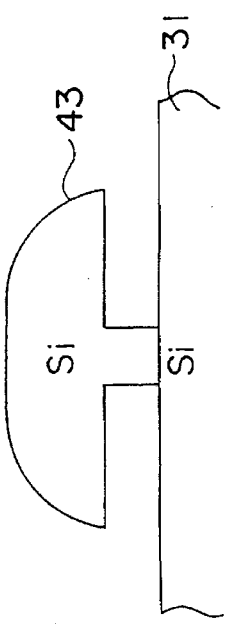
Figure 10C:
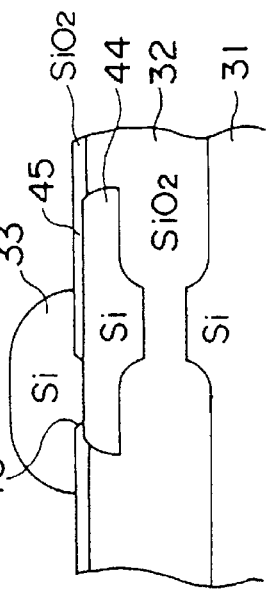
Figure 10D:
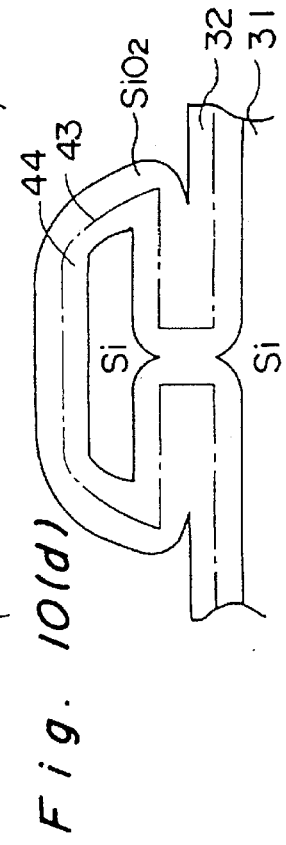

Thereafter, the above described seed grain 44 is epitaxially grown through the window 46 of the SiO$_2$ layer 45 formed with Si thermal oxidation on the surface. The Si single crystal island 33 projected into an island shape is formed on the top face of the above described insulation separation layer 32 as shown in FIG. 10(f) and FIG. 10(g) with an A–A' sectional view of FIG. 10(f). The Si single crystal island 33 is a single crystal of the Si epitaxially grown with the seed grain 44 from the Si basic plate 31 as a seed, and has a crystal bearing the same as the Si basic plate 31. The Si seed grain 44 injects the B$^+$ ion into the Si single crystal island formed on it so as to form into a N$^-$ type.

Figure 10H:
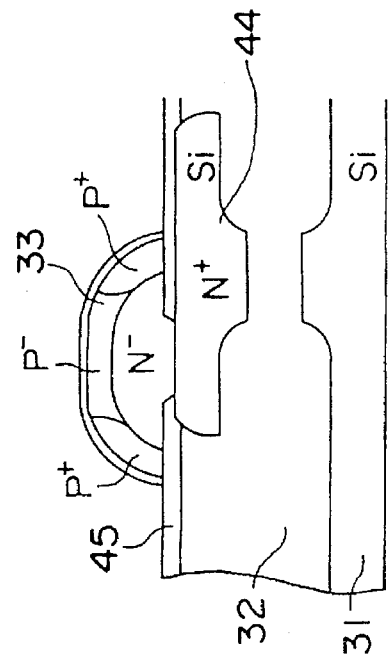

The SiO$_2$ layer 47 is formed with thermal oxidation on the surface of the Si single crystal island 33 as shown in FIG. 10(h). Thereafter, a B$^+$ ion is injected into the given position of the N type Si single crystal island 33 through the SiO$_2$ layer 47 with masking on the N type Si single crystal island 33 so as to form a P$^-$ layer on the N$^-$ layer of the Si.

Figure 10J:
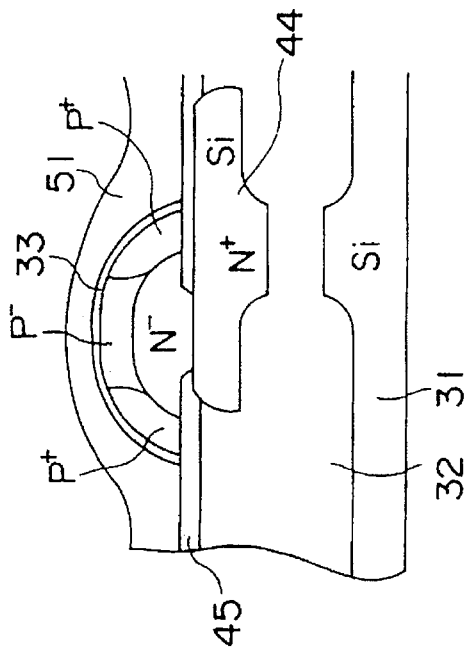
Figure 10I:
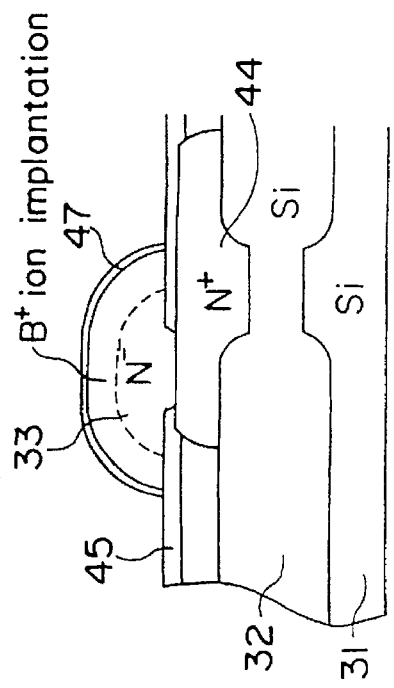

After the upper one portion of the N type of Si single crystal island 33N is coated with resist 57 as shown in FIG. 10(i), an BF$^+$ ion is injected into both the side portions of the P$^-$ layer of the N type Si single crystal island 33 so as to form both the side portions of the P$^-$ layer onto the P$^+$ layer. Thereafter, the whole shown in in FIG. 10(j) is annealed for thirty minutes with a N$_2$ atmosphere of 900° C.

Figure 10K:
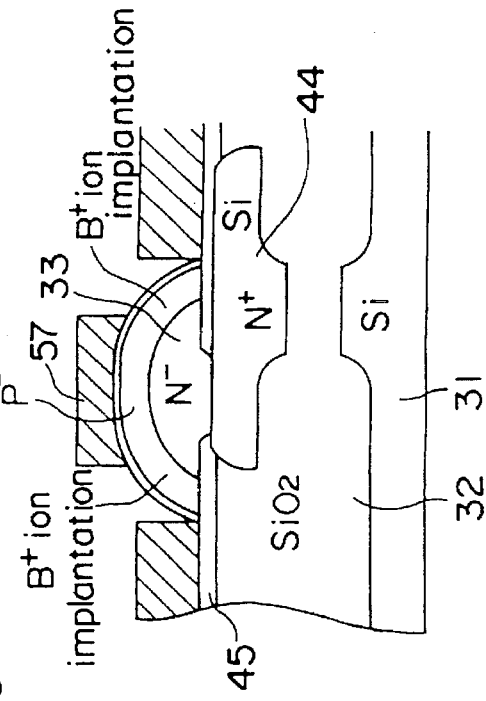

A CVDSiO$_2$ layer 51 is formed on the whole surfaces as shown in FIG. 10(k) so as to remove one portion into the CVDSiO$_2$ layer 5. As shown in FIG. 10(l), a hole 5 of a contact is drilled. A poly Si53 is formed on the surface of the SiO$_2$ layer 51. As shown in FIG. 10(m), one portion of the poly Si is removed and is separated.

As shown in FIG. 10(n), the whole is coated with resist 54 except for the poly Si hole of top face one portion of the N type Si single crystal island 33N, an As ion is thrown into the P$^-$ layer of the N type Si single crystal island 3N so as to form the N$^+$ layer on the top portion of the P$^-$ layer. Thereafter, all these portions are annealed and diffused.

Thereafter, a metal 35 is inserted into the above described hole 52. Metal wiring is formed into the hole 52 so as to form the wirings of the base, the emitter, the collector, and finally, a passivation 37 is provided as shown in FIG. 7. The PNP type transistor can be made as shown in FIG. 7, and FIG. 8 in this manner.

The semiconductor apparatus can be composed of a single Si basic plate, an insulation separation layer formed on the Si basic plate, a Si single crystal island having a crystal bearing the same as the above described Si basic plate projected, formed into the island shape respectively on the insulation separation layer, a PPN transistor formed on one island of the Si single crystal island.

An IIL gate element obtained by such a making step as described hereinabove can contract the element area by the insulation separation, for example, reduce by 62% as compared with the conventional product in the NPN type and also, can reduce by 77% as compared with the conventional product in the PNP type.

As is clear from the foregoing description, the IIL gate element in accordance with the present embodiment is formed on the single crystal island of the Si with the device being surrounded with insulating materials in the sample making step, and has no parasitic junctions, the parasitic effects are not caused. The parasitic capacity can be reduced. As the gain can be combined with the NPN type transistor with the vertical type of PNP type transistor being formed, it may be made into a complementary type. The size of the seed window (with degree of freedom being provided in length instead of width) is changed so that the single crystal island of the size necessary for the element formation can be formed, an extrinsic base with the surrounding portion of the base being high in concentration is formed, $r_{bb}$, can be reduced so as to improve the high frequency property and the low noise property, and the collector is put into contact from the standard crystal portion so that the low series resistance can be obtained.

The high gain of the PNP transistor is obtained, the electronic injection into the NPN base is effected evenly from the PNP so as to reduce the positional dependence of the F/O. As the circumference of the NPN base is surrounded with an insulating film, the CGB is made smaller as compared with the conventional P/N splicing so that higher speed processing operation can be effected, and further, the I$^2$L gate area can be reduced.

(Embodiment 3)

Figure 11:
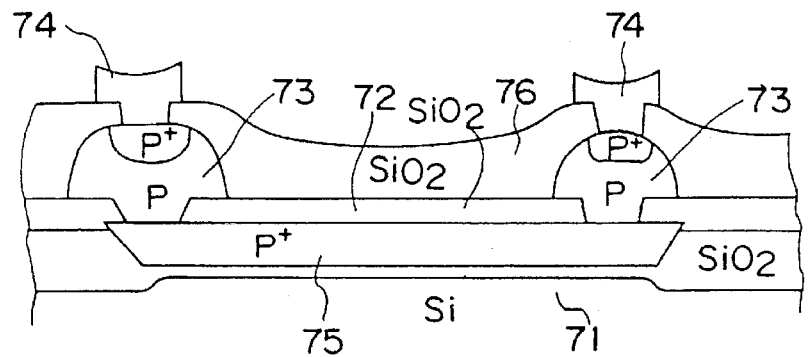
FIG. 11 is a flow chart showing a making order of a Si single crystal island of the semiconductor element of the present invention.
Figure 12:
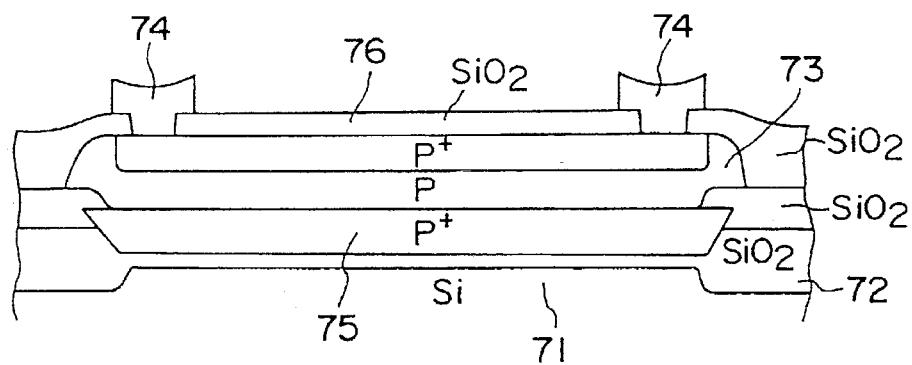
FIG. 12 is a flow chart showing a making order of an element of FIG. 1.

A semiconductor resistance element shown in FIG. 11, FIG. 12 is provided with a Si basic plate 71, an insulation separation layer 72 formed on the Si basic plate 71, a Si single crystal island 73 having a crystal bearing the same as the above described Si basic plate 71 projected, formed into an island shape on the insulation separation layer 72, a resistance terminal 74 respectively connected with both the ends of the Si single crystal island 73. In FIG. 11, a P$^+$, a P, a P$^+$ layers constitute the resistance portion of series connection. In FIG. 12, a P$^+$, a P, a P$^+$ layers constitute the resistance portion of parallel connection.

Namely, the resistance elements of FIG. 11, FIG. 12 are composed of a Si basic plate 71, a SiO$_2$ insulation separation layer 72, a Si single crystal layer 75 of non • dope or P$^+$ or N$^+$ formed on the SiO$_2$ insulation separation layer 72, a pair of Si single crystal islands 73 independently, separatedly formed respectively on both the sides on the Si single crystal layer 75, an Al terminal 74 provided on the Si single crystal island 73, an insulation coated layer 76 of SiO$_2$. A pair of Si single crystal island 73 (high resistance) and a Si single crystal island layer 75 (low resistance) are used as a resistance portion connected in series. In the Si single crystal layer 75, the P$^+$ may be the N$^+$ or the P may be the N.

Figure 13:
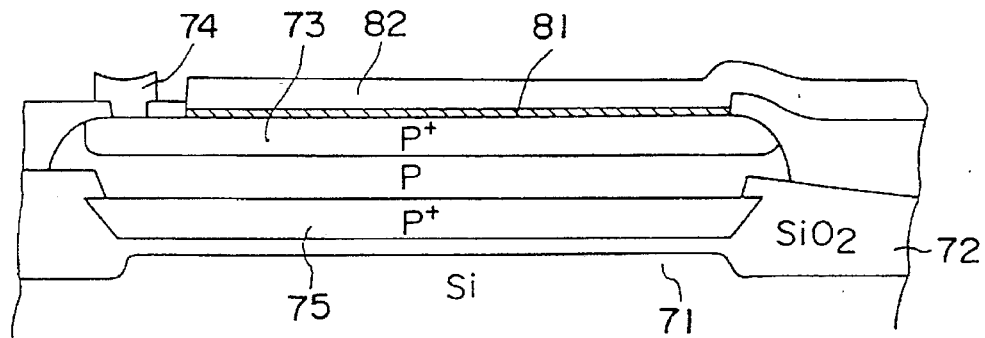
FIG. 13 is a flow chart showing a making order of an element of FIG. 2.
Figure 14:
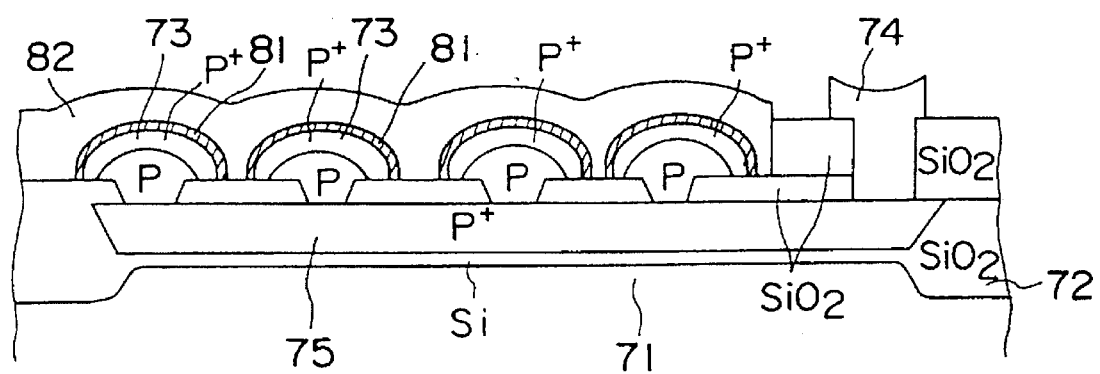
FIG. 14 is a flow chart showing a making order of an element of FIG. 3.

The semiconductor capacity element shown in FIG. 13, FIG. 14 form an insulation separation layer 72 on the Si basic plate 71, one portion of the above described Si basic plate is epitakicially grown on the insulation separation layer to project, form into an island shape the Si single crystal island 73 having a crystal bearing the same as the above described Si basic plate. The dielectric layer 82 is formed on the Si single crystal island 73 so as to connect the upper portion of the dielectric layer and the above described single crystal island respectively with the capacity terminals 74, 82. In FIG. 11 and FIG. 12, the dielectric layer 81 constitutes a capacity portion.

Namely, the capacity element of FIG. 13, FIG. 14 is composed of a Si basic plate 71, a SiO$_2$ insulation separation later 72, a Si single crystal 76 of non • dope or P$^+$ or N$^+$ formed on the SiO$_2$ insulation separation layer 72, a Si single crystal island 73 having the crystal bearing the same as the Si basic plate projected into an island shape on the Si single crystal layer 76 and formed in an independently separated condition, a dielectric layer 81 of $SiO_2$ or $Si_3N_4$ formed on the surface of the Si single crystal island 73, one side terminal 82 of Al provided on the dielectric layer 81, the other side terminal 74 of Al provided in connection with the above described Si single crystal island in a condition insulatingly separated from the one side terminal, with the above described dielectric layer 81 being used as the capacity portion. The Si single crystal island 73 and the dielectric layer 81 provided on the surface may be provided in parallel by one or more on the Si single crystal layer 73. In FIG. 14, four is provided. It is to be noted that in the Si single crystal layer 75, the $P^+$ may be the $N^+$ and the P may be the N.

The making step of the Si single crystal layer and the Si single crystal island of each of the above described passive elements will be described hereinafter with reference to FIG. 15.

In FIG. 15(a), a $SiO_2$ layer 72 is formed on the surfaces of the Si basic plate 71 with Si thermal oxidation so as to form a window on a $SiO_2$ layer (72) with a seed window P.R./P.E.

The Si basic plate 61 is epitaxially grown through the above described window 72 so as to form a Si standard crystal 73 having a crystal bearing the same as the above described Si basic plate 71 projected into an island shape on the $SiO_2$ layer from the window 72 as shown in FIG. 15(b), thereafter impurities 85 of N type of $As^+$ or P type of $B^+$ are introduced with an ion injection into the Si standard crystal 73.

The above described $SiO_2$ 72 is peeled off with etching as shown in FIG. 5(c) so that only the above described Si standard crystal 73 may projected into a head shape from the Si basic plate 71 and may remain. The Si basic plate 71 and the Si standard crystal 73 exposed in this manner are Si thermally oxidized again and the central core portion of the Si standard crystal 73 is left as a seed grain 74 as shown in FIG. 15(d). In this condition, the insulation separation layer 62 is formed on the whole circumference of the seed grain 74 and the whole surface of the Si basic plate.

Spin on glass (SOG) 86 is applied on the top face of the above described insulation separation layer 72. The top portion of the insulation separation layer 72 surrounding the seed grain 74 projected into the head shape with a levelled etch back and the SOG 86 applied on it are removed after annealing so as to level the surfaces. As shown in FIG. 10(e), the seed gain 74, the insulation separation layer 72 on the sideway circumference and the SOG 86 on the further external periphery become exposed as one plane face.

Thereafter, the above described seed grain 75 is epitaxially grown. The Si single crystal island 73 projected into an island shape is formed on the top face of the above described insulation separation layer 62 as shown in FIG. 15(f) and FIG. 15(g). The Si single crystal island 73 is a single crystal of the Si epitaxially grown from the Si basic plate 71, and has a crystal bearing the same as the Si basic plate 71. The Si seed grain 75 is a $N^-$ or $P^+$ type as the Si crystal layer. The Si single crystal island 73 formed on it injects the $B^+$ ion or the $As^+$ ion so as to form it into the $N^-$ type or the $P^+$ type. The resistance element is formed by the making step of FIG. 16 or FIG. 17 with the use of a pair of Si single crystal islands 73 formed in this manner.

The resistance element of FIG. 11 is formed in a making step of FIG. 16 and the resistance element of FIG. 12 is formed in the making step of FIG. 17.

Figure 16A:
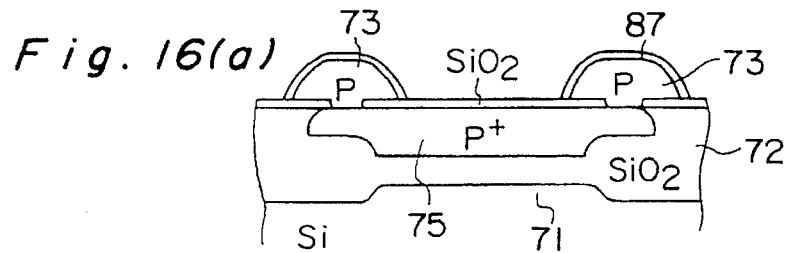
FIG. 16, (a) to (e), is a sectional view of an IIL gate element of the present invention.
Figure 16B:
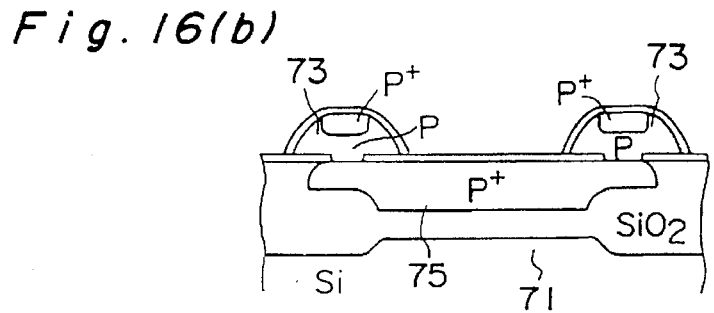

As shown in FIG. 16(a), the $SiO_2$ layer 87 is formed with thermal oxidation on the surface of the Si single crystal island 73. As shown in FIG. 16(b), the ion of $P^-$ and $P^{30}$ ions are injected into the given position of the Si single crystal island 73 through the $SiO_2$ layer 87.

Figure 16C:
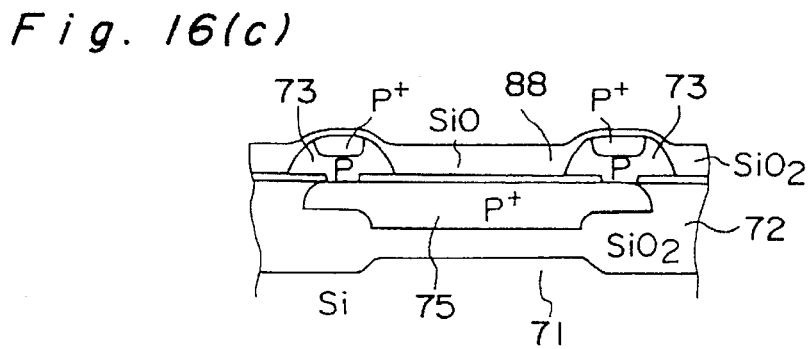
Figure 16D:
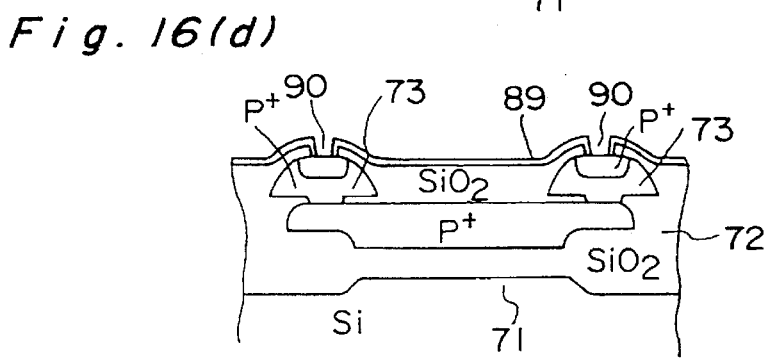
Figure 16E:
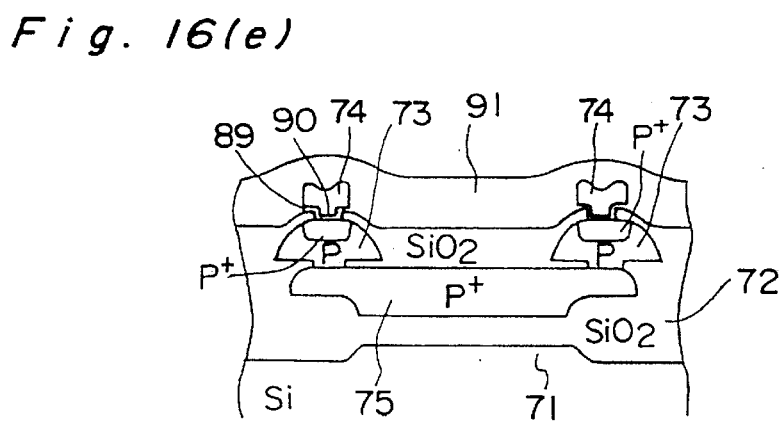
Figure 17A:
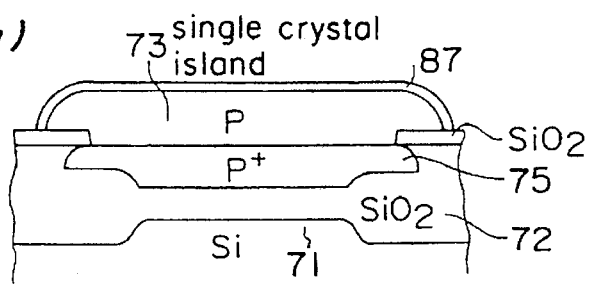
FIG. 17, (a) to (e), is a plan view of an IIL gate element of FIG. 1.
Figure 17B:
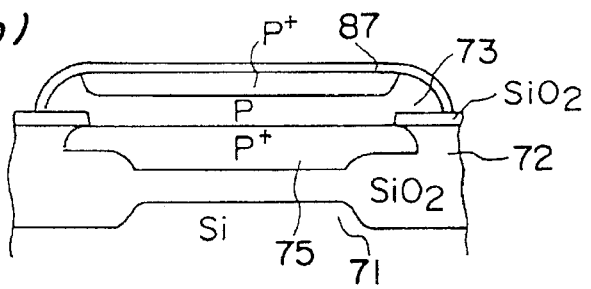
Figure 17C:
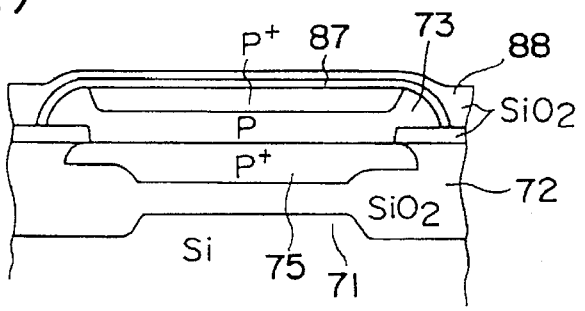
Figure 17D:
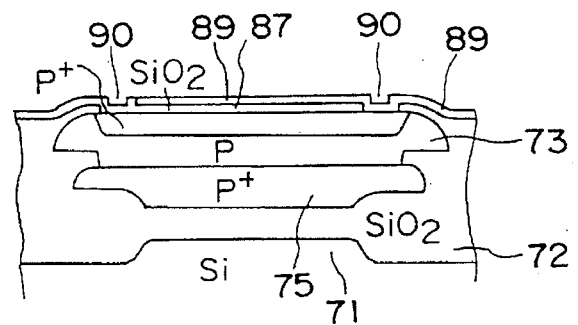
Figure 17E:
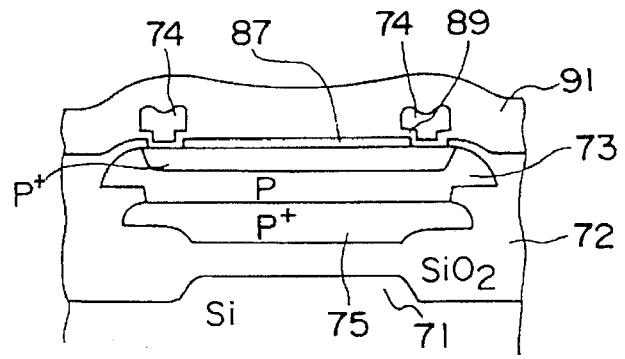
Figure 18A:
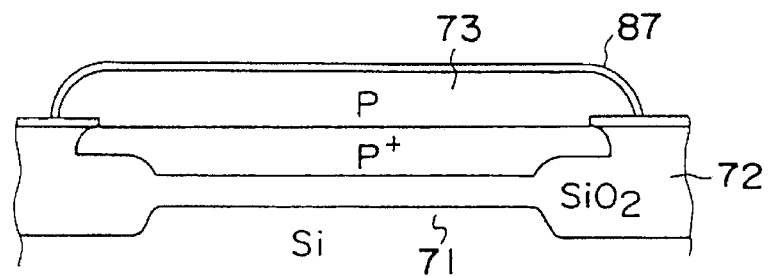
FIG. 18, (a) to (d), is a circuit diagram of an IIL gate element of FIG. 1.
Figure 18B:
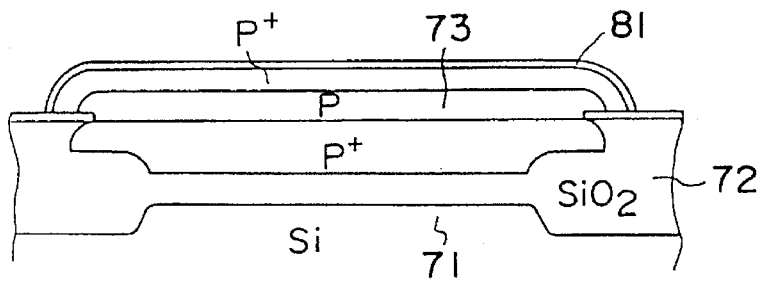
Figure 18C:
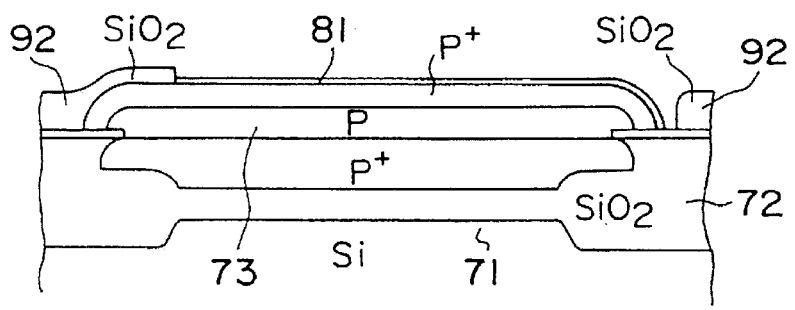
Figure 18D:
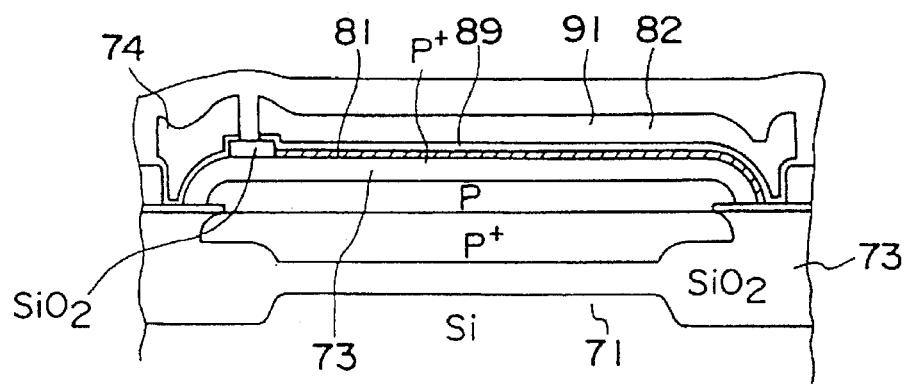
Figure 19A:
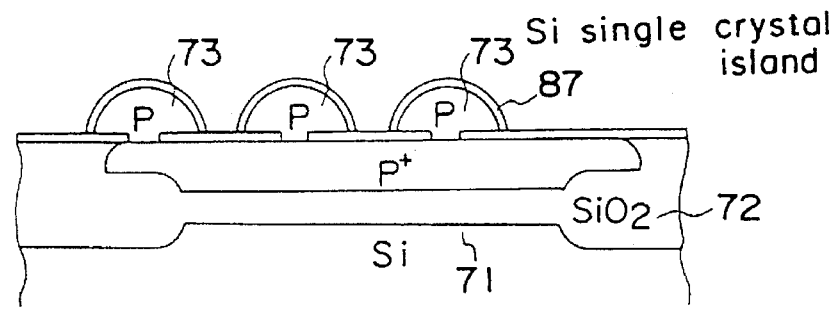
FIG. 19, (a) to (d), is a flow chart showing making orders (1) through (14) of an IIL gate element of FIG. 1.
Figure 19B:
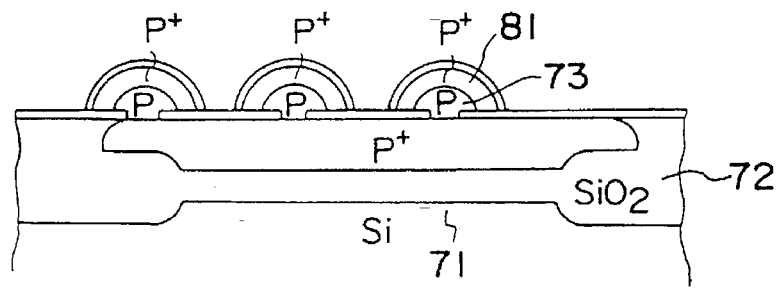
Figure 19C:
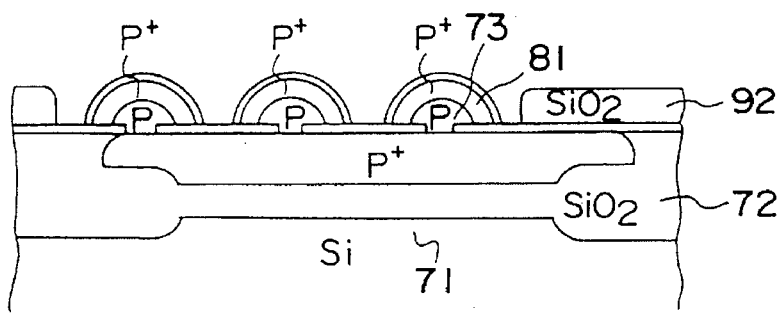
Figure 19D:
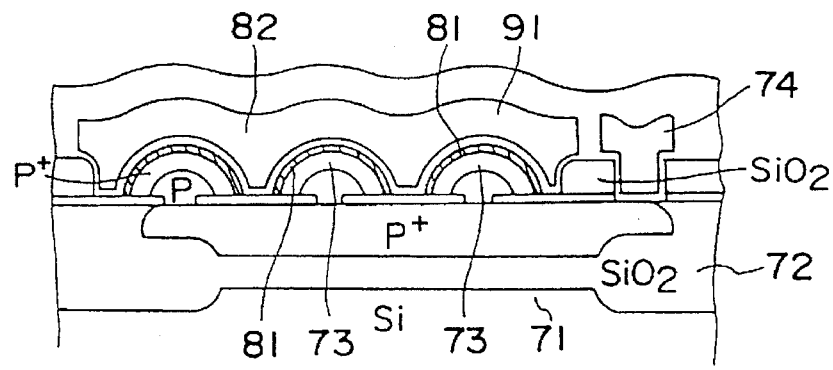
Figure 20:
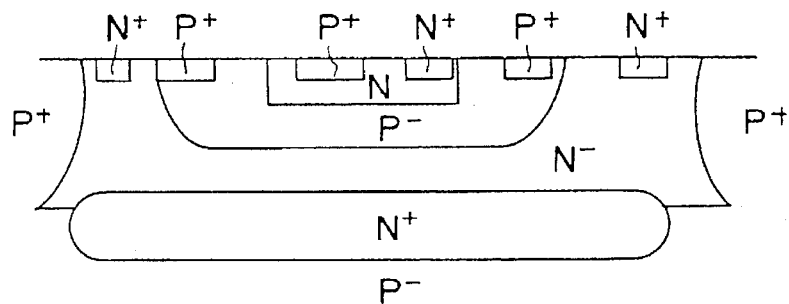
FIG. 20 is a sectional view of a transistor of the conventional threshold diffusing system.
Figure 21:
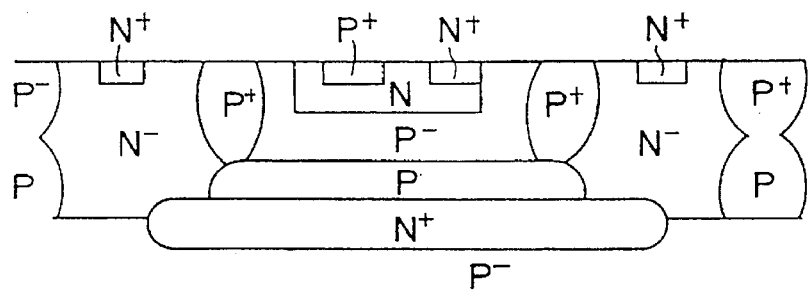
FIG. 21 is a sectional view of a transistor of the conventional P-WELL system.
Figure 22:
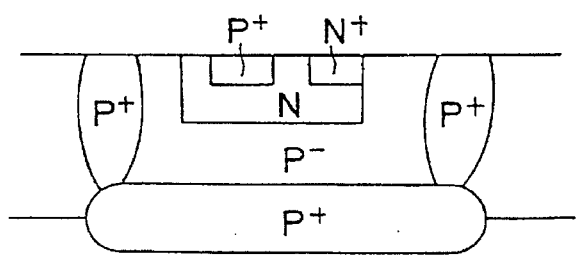
FIG. 22 is a sectional view of a transistor of the conventional Sub-PNP system.

The CVD $SiO_2$ layer 88 is formed (FIG. 16(c)) on the whole surfaces and also, the poly Si 89 is formed (FIG. 16(d)) on the surface of the $SiO_2$ layer 88 so as to remove one portion of the poly Si89 and drill a hole. Wiring 74 of the Al metal is formed in the hole 90 so as to form the terminal (FIG. 16(e)). Thereafter, a passivation 91 is provided as shown in FIG. 16(e) so as to obtain the resistance element as shown in FIG. 11. As the making step of FIG. 17(a) to (e) is also similar to the making step of FIG. 16(a) to (e), the description thereof will be described.

A capacity element is formed with the making step of FIG. 18 or FIG. 19 with the use of one Si single crystal island 73 or a plurality of Si single crystal islands formed in FIG. 15. The capacity element of FIG. 13 is formed in the making step of FIG. 18. The capacity element of FIG. 14 is formed in the making step of FIG. 19. As shown in FIG. 18(a), the Si single crystal island 73 projected into the island shape on the top face of the insulation separation layer 72. Thereafter, the $SiO_2$ layer 87 is formed with oxidation on the surface of the Si single crystal island 73 as shown in FIG. 18(a). The ions of $P^-$ and $P^+$ are injected into the given position of the Si single crystal island 73 through the $SiO_2$ layer 87 with masking as shown in FIG. 18(b). Further, the dielectric layer 81 of the $SiO_2$ or the $SiN_4$ is formed on one portion of the top face of the SiO single crystal island 73 so as to form the poly Si 89 on the surface of the dielectric layer 81 and the circumference is coated (FIG. 18(c)) with the $SiO_2$ insulation coated layer 92. The terminal 74 of the Al is provided in connection with one portion of the above described Si single crystal island 73. The terminal 82 of the Al is provided (FIG. 18(d)) is provided on the above described dielectric layer. Thereafter, the passivation is provided so as to obtain the capacitor element as shown in FIG. 13. As the making step of FIG. 19, (a) to (d) is also similar to the making step of FIG. 18, (a) to (d), the description thereof is omitted.

The semiconductor apparatus obtained at such a making step as described hereinabove can contract the element area by the insulation separation. In, for example, the NPN type, 62% can be reduced as compared with the conventional product. Also, 77% can be reduced as compared with the conventional product in the PNP type.

As is clear from the foregoing description, the semiconductor passive element in the present embodiment insulates, separates the unnecessary diffusion layer completely, and has a crystal bearing the same as the Si basic plate. The individual independent functional elements are formed on the single crystal island of the Si insulted, separated from the Si basic plate. As the functional element of each resistance or capacity is insulated, separated in bottom face from the Si basic plate, each Si single crystal island is respectively on side face independent and is separated with insulating materials completely among the respective islands. Therefore, as the resistance element of the present invention is superior in high frequency characteristics as the resistance has no parasitic PN splicing. Also, the temperature coefficient can be changed by the change in the impurity dope amount in the single crystal. As the change in the resistance value can be coped with the impurity dope amount or the shape of the single crystal island. As the capacity element uses the single crystal floated from the Si basic plate for the lower electrode, the low resistance can be obtained as compared with the poly Si and the frequency characteristics become better. The contraction of the area can be effected with the bump shaping of the groundwork.

Although the present invention has been fully described by way of example with reference to the accompanying drawings, it is to be noted here that various changes and modifications will be apparent to those skilled in the art. Therefore, unless otherwise such changes and modifications depart form the cope of the present invention, they should be construed as included therein.

What is claimed is:

1. A method of making a semiconductor device, comprising the steps of:

forming an insulation layer on a first surface portion of an Si substrate;

subjecting an exposed second surface portion of the Si substrate to epitaxial growth to form a monocrystalline Si island having a crystal orientation which is the same as that of the Si substrate, the monocrystalline Si island having a first portion which is contiguous with the Si substrate and a second portion which extends partially over the insulation layer such that the insulation layer is interposed between the Si substrate and the second portion of monocrystalline Si island;

converting the first portion of the monocrystalline Si island into an insulator to separate and electrically insulate the second portion of the monocrystalline Si island from the Si substrate; and forming a transistor on the second portion of the monocrystalline Si island;

wherein the exposed second surface portion of said step of subjecting is formed in said step of forming by subjecting the Si substrate to thermal oxidation so as to form the insulation layer with a window therein; and wherein the insulation layer is removed after said step of subjecting and before said step of converting.

2. The method of claim 1, wherein said step of converting further comprises thermally oxidizing the Si substrate and the first and second portions of the monocrystalline Si island.

3. A method of making an IIL gate element comprising the steps of:

forming an insulation layer on a first surface position of an Si substrate;

subjecting an exposed second surface portion of the Si substrate to epitaxial growth to form a monocrystalline Si island having a crystal orientation which is the same as that of the Si substrate, the monocrystalline Si island having a first portion which is contiguous with the Si substrate and a second portion which extends partially over the insulation layer such that the insulation layer is interposed between the Si substrate and the second portion of monocrystalline Si island;

converting the first portion of the monocrystalline Si island into an insulator to separate and electrically insulate the second portion of the monocrystalline Si island from the Si substrate; and forming a laminating a P+ layer, on N layer, a P layer and N- layer sequentially in the second portion of the monocrystalline Si island;

wherein the exposed second surface portion in said step of subjecting is formed in said step of forming by subjecting the Si substrate to thermal oxidation so as to form the insulation layer with a window therein; and wherein the insulation layer is removed after said step of subjecting and before said step of converting.

4. The method of claim 3, wherein said step of converting further comprises thermally oxidizing the Si substrate and the first and second portions of the monocrystalline Si island.

5. A method of making a semiconductor passive element, comprising the steps of:

forming an insulation layer on a first surface portion of an Si substrate;

subjecting an exposed second surface portion of the Si substrate to epitaxial growth to form a monocrystalline Si island having a crystal orientation which is the same as that of the Si substrate, the monocrystalline Si island having a first portion which is contiguous with the Si substrate and a second portion which extends partially over the insulation layer such that the insulation layer is interposed between the Si substrate and the second portion of monocrystalline Si island; and converting the first portion of the monocrystalline Si island into an insulator to separate and electrically insulate the second portion of the monocrystalline Si island from the Si substrate;

wherein the exposed second surface portion of said step of subjecting is formed in said step of forming by subjecting the Si substrate to thermal oxidation so as to form the insulation layer with a window therein; and wherein the insulation layer is removed after said step of subjecting and before said step of converting.

6. The method of claim 5, wherein said step of converting further comprises thermally oxidizing the Si substrate and the first and second portions of the monocrystalline Si island.

7. A method of making a semiconductor passive element, comprising the steps of:

forming an insulation layer on a first surface portion of an Si substrate;

subjecting an exposed second surface portion of the Si substrate to epitaxial growth to form a monocrystalline Si island having a crystal orientation which is the same as that of the Si substrate, the monocrystalline Si island having a first portion which is contiguous with the Si substrate and a second portion which extends partially over the insulation layer such that the insulation layer is interposed between the Si substrate and the second portion of monocrystalline Si island;

converting the first portion of the monocrystalline Si island into an insulator to separate and electrically insulate the second portion of the monocrystalline Si island from the Si substrate;

forming a dielectric layer having an upper portion on the monocrystalline Si island; and connecting a terminal with the upper portion of the dielectric layer and the monocrystalline Si island;

wherein the exposed second surface portion of said step of subjecting is formed in said step of forming by subjecting the Si substrate to thermal oxidation so as to form the insulation layer with a window therein; and wherein the insulation layer is removed after said step of subjecting and before said step of converting.

8. The method of claim 7, wherein said step of converting further comprises thermally oxidizing the Si substrate and the first and second portions of the monocrystalline Si island.

* * * * *